United States Patent
Hoshtanar et al.

(10) Patent No.: US 8,872,526 B1
(45) Date of Patent: Oct. 28, 2014

(54) INTERLEAVING SENSE ELEMENTS OF A CAPACITIVE-SENSE ARRAY

(71) Applicant: Cypress Semiconductor Corporation, San Jose, CA (US)

(72) Inventors: Oleksandr Hoshtanar, Lviv (UA); Igor Kravets, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/098,057

(22) Filed: Dec. 5, 2013

Related U.S. Application Data

(60) Provisional application No. 61/875,863, filed on Sep. 10, 2013.

(51) Int. Cl.
  *G01R 27/26* (2006.01)
  *G06K 9/00* (2006.01)
  *G01D 5/24* (2006.01)

(52) U.S. Cl.
  CPC .......... *G01R 27/2605* (2013.01); *G06K 9/0002* (2013.01); *G01D 5/24* (2013.01)
  USPC ........................................................ 324/658

(58) Field of Classification Search
  CPC ............ G06F 2203/04112; G06F 2203/04103; G06F 2203/04104; G06F 3/044; G06F 3/0416; H03K 17/955; H03K 17/962; H03K 2017/9602; B60R 2021/01529; G01D 5/24; G06K 7/081; G01R 27/2605; G01R 33/0094
  USPC ........................................................ 324/658
  See application file for complete search history.

(56) References Cited

U.S. PATENT DOCUMENTS

| 7,129,935 | B2 | 10/2006 | Mackey |
| 7,663,607 | B2 | 2/2010 | Hotelling et al. |

(Continued)

FOREIGN PATENT DOCUMENTS

| EP | 2214084 A | 8/2010 |
| EP | 2592533 A | 5/2013 |

(Continued)

OTHER PUBLICATIONS

U.S. Appl. No. 13/241,514: "Accuracy in a Capacitive Sense Array" Tao Peng et al., filed Sep. 23, 2011; 34 pages.

(Continued)

*Primary Examiner* — Jermele M Hollington
*Assistant Examiner* — Sean Curtis
(74) *Attorney, Agent, or Firm* — Lowenstein Sandler LLP

(57) ABSTRACT

Apparatuses and methods of sense arrays with interleaving sense elements are described. One capacitive-sense array includes a first electrode and a second electrode disposed adjacent to the first electrode in a first axis. The capacitive-sense array comprises a sensor pitch in the first axis. The first electrode includes a first sense element including a first shape and a first interleaving sense element that interleaves with a first portion and a second portion of the second electrode to extend a first dimension of the first electrode to be greater than the sensor pitch in the first axis. The second electrode includes a second sense element including the first shape and a second interleaving sense element that interleaves with a first portion and a second portion of the first electrode to extend a second dimension of the second electrode to be greater than the sensor pitch in the first axis.

19 Claims, 15 Drawing Sheets

(56) References Cited

U.S. PATENT DOCUMENTS

| | | | |
|---|---|---|---|
| 7,755,026 B2 | 7/2010 | Pittel et al. | |
| 7,755,612 B2 | 7/2010 | Park et al. | |
| 7,864,160 B2* | 1/2011 | Geaghan et al. | 345/173 |
| 8,004,497 B2* | 8/2011 | XiaoPing | 345/173 |
| 8,174,507 B2* | 5/2012 | XiaoPing | 345/173 |
| 8,217,916 B2 | 7/2012 | Anno | |
| 8,237,453 B2* | 8/2012 | Badaye et al. | 324/658 |
| 8,432,170 B1* | 4/2013 | Walsh et al. | 324/658 |
| 8,502,796 B1 | 8/2013 | Yilmaz | |
| 8,519,973 B1* | 8/2013 | XiaoPing | 345/173 |
| 8,531,418 B2 | 9/2013 | Nolting et al. | |
| 8,536,880 B2 | 9/2013 | Philipp | |
| 8,614,690 B2 | 12/2013 | Grunthaner et al. | |
| 8,648,819 B2* | 2/2014 | Philipp | 345/173 |
| 2005/0200799 A1 | 9/2005 | Murai | |
| 2007/0008299 A1 | 1/2007 | Hristov | |
| 2007/0257894 A1* | 11/2007 | Philipp | 345/173 |
| 2007/0268265 A1* | 11/2007 | XiaoPing | 345/173 |
| 2007/0268266 A1 | 11/2007 | Xiaoping | |
| 2009/0002396 A1 | 1/2009 | Andrews et al. | |
| 2009/0159344 A1* | 6/2009 | Hotelling et al. | 178/18.06 |
| 2009/0267916 A1 | 10/2009 | Hotelling | |
| 2009/0303196 A1 | 12/2009 | Furukawa | |
| 2010/0045614 A1* | 2/2010 | Gray et al. | 345/173 |
| 2010/0045615 A1 | 2/2010 | Gray et al. | |
| 2010/0073301 A1 | 3/2010 | Yousefpor et al. | |
| 2010/0079402 A1 | 4/2010 | Grunthaner et al. | |
| 2010/0096193 A1* | 4/2010 | Yilmaz et al. | 178/18.06 |
| 2010/0163394 A1 | 7/2010 | Tang et al. | |
| 2010/0214233 A1 | 8/2010 | Lee | |
| 2010/0220075 A1 | 9/2010 | Kuo et al. | |
| 2010/0271330 A1* | 10/2010 | Philipp | 345/174 |
| 2010/0295821 A1 | 11/2010 | Chang et al. | |
| 2010/0302201 A1* | 12/2010 | Ritter et al. | 345/174 |
| 2011/0025629 A1* | 2/2011 | Grivna et al. | 345/173 |
| 2011/0063251 A1 | 3/2011 | Geaghan et al. | |
| 2011/0095990 A1 | 4/2011 | Philipp et al. | |
| 2011/0141062 A1 | 6/2011 | Yu et al. | |
| 2011/0157050 A1 | 6/2011 | Jang et al. | |
| 2011/0171998 A1 | 7/2011 | Westerman | |
| 2011/0279410 A1* | 11/2011 | Han et al. | 345/174 |
| 2012/0044201 A1* | 2/2012 | XiaoPing | 345/174 |
| 2012/0062472 A1 | 3/2012 | Yilmaz | |
| 2012/0062510 A1 | 3/2012 | Mo et al. | |
| 2012/0127099 A1* | 5/2012 | Liu et al. | 345/173 |
| 2012/0154324 A1* | 6/2012 | Wright et al. | 345/174 |
| 2012/0169651 A1 | 7/2012 | Chang | |
| 2012/0169653 A1 | 7/2012 | Chang | |
| 2012/0169655 A1 | 7/2012 | Chang | |
| 2012/0169656 A1 | 7/2012 | Chang | |
| 2012/0268416 A1* | 10/2012 | Pirogov et al. | 345/174 |
| 2012/0319974 A1 | 12/2012 | Kim et al. | |
| 2013/0033451 A1* | 2/2013 | Olson | 345/174 |
| 2013/0049771 A1* | 2/2013 | Peng et al. | 324/658 |
| 2013/0082719 A1 | 4/2013 | Prendergast et al. | |
| 2013/0242485 A1 | 9/2013 | Ohtani et al. | |
| 2013/0285975 A1 | 10/2013 | Hong et al. | |
| 2014/0125361 A1* | 5/2014 | Tevs | 324/679 |
| 2014/0152919 A1* | 6/2014 | Philipp | 349/12 |
| 2014/0160374 A1 | 6/2014 | Wang et al. | |

FOREIGN PATENT DOCUMENTS

| | | | |
|---|---|---|---|
| KR | 20100032283 A | 3/2010 | |
| KR | 100979910 B1 | 9/2010 | |
| KR | 20100116281 A | 11/2010 | |
| WO | 2008079596 A1 | 7/2008 | |
| WO | 2011015827 A | 2/2011 | |

OTHER PUBLICATIONS

International Search Report for International Application No. PCT/US11/53649 dated Oct. 30, 2012; 3 pages.

USPTO Non Final Rejection for U.S. Appl. No. 13/241,514 dated Nov. 12, 2013; 11 pages.

USPTO Notice of Allowance for U.S. Appl. No. 13/241,514 dated Feb. 24, 2014; 7 pages.

USPTO Notice of Allowance for U.S. Appl. No. 13/241,514 dated Apr. 1, 2014; 8 pages.

USPTO Notice of Allowance for U.S. Appl. No. 13/241,514 dated May 13, 2014; 7 pages.

USPTO Notice of Allowance for U.S. Appl. No. 13/241,514 dated Jun. 27, 2014; 7 pages.

Written Opinion of the International Searching Authority for International Application No. PCT/US11/53649 dated Oct. 30, 2012; 5 pages.

U.S. Appl. No. 14/297,115: "Sensor Pattern With Signal-Spreading Electrodes" Oleksandr Hoshtanar et al., filed Jun. 5, 2014; 58 pages.

ST Microelectronics, "Guidelines for Designing Touch Sensing Applications with Surface Sensors", retrieved from http://www.st.com/st-web-ui/static/active/jp/resource/technical/document/application_note/DM00087990.pdf, dated Sep. 30, 2013; 36 pages.

USPTO Non Final Rejection for U.S. Appl. No. 14/297,115 dated Sep. 19, 2014; 16 pages.

\* cited by examiner

US 8,872,526 B1

INTERLEAVING SENSE ELEMENTS OF A CAPACITIVE-SENSE ARRAY

RELATED APPLICATIONS

This application claims the benefit of U.S. Provisional Application No. 61/875,863, filed Sep. 10, 2013, the entire contents of which are incorporated by reference herein.

TECHNICAL FIELD

The present disclosure relates generally to sensing systems, and more particularly to capacitance-sensing systems configurable to determine touch locations of touches on the capacitive-sensing systems.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Transparent touch screens that utilize capacitive sense arrays are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element, and looking for a delta in capacitance indicating a touch or presence of a conductive object. When a conductive object (e.g., a finger, hand, or other object) comes into contact or close proximity with a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance: 1) mutual capacitance where the capacitance-sensing circuit has access to both electrodes of the capacitor; 2) self-capacitance where the capacitance-sensing circuit has only access to one electrode of the capacitor where the second electrode is tied to a DC voltage level or is parasitically coupled to Earth Ground. A touch panel has a distributed load of capacitance of both types (1) and (2) and Cypress' touch solutions sense both capacitances either uniquely or in hybrid form with its various sense modes.

BRIEF DESCRIPTION OF THE DRAWINGS

The present invention is illustrated by way of example, and not of limitation, in the figures of the accompanying drawings.

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Apparatuses and methods of sense arrays with interleaving sense elements are described. One capacitive-sense array includes a first electrode and a second electrode disposed adjacent to the first electrode in a first axis. The capacitive-sense array comprises a sensor pitch in the first axis. The first electrode includes a first sense element including a first shape and a first interleaving sense element that interleaves with a first portion and a second portion of the second electrode to extend a first dimension of the first electrode to be greater than the sensor pitch in the first axis. The second electrode includes a second sense element including the first shape and a second interleaving sense element that interleaves with a first portion and a second portion of the first electrode to extend a second dimension of the second electrode to be greater than the sensor pitch in the first axis. In some embodiments, the first dimension is greater than the sensor pitch in the first axis by two or more. The embodiments described herein include different shapes and patterns with interleaving sense elements. Embodiments of interleaving sense elements can be disposed so that a dimension (width or height) of the electrode is more than the sensor pitch in that dimension. In some cases, the dimension is twice or more than twice the sensor pitch in that dimension. In other embodiments, the dimension may be greater than the sensor pitch by other factors than two. The embodiments described herein are directed to specific geometries, but other geometries of the shapes and patterns can be utilized. In some embodiments, the interleaving sense elements can be used in one dimension. In other embodiments, the interleaving sense elements can be used in multiple dimensions. Various embodiments of the interleaving sense elements are described below with respect to FIGS. 4-14.

Figure 1:
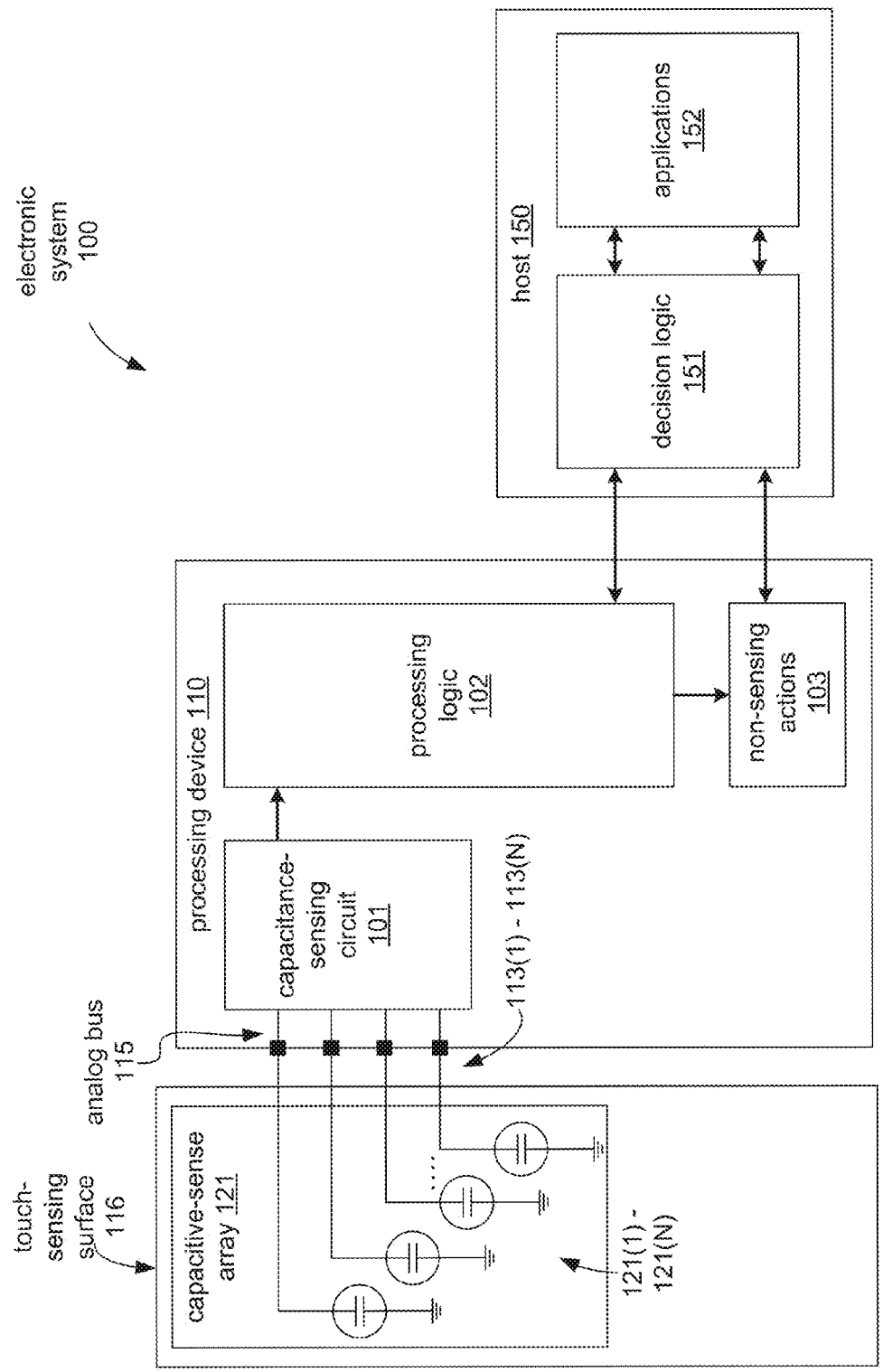
FIG. 1 is a block diagram illustrating an embodiment of an electronic system that processes touch data.

FIG. 1 illustrates a block diagram of one embodiment of an electronic system 100 including a processing device 110 that may be configured to measure capacitances from a touch-sensing surface 116 including a capacitive-sense array 121. In one embodiment, a multiplexer circuit may be used to connect a capacitive-sensing circuit 101 with a sense array 121. The electronic system 100 includes a touch-sensing surface 116 (e.g., a touchscreen, or a touch pad) coupled to the processing device 110, which is coupled to a host 150. In one embodiment the touch-sensing surface 116 is a two-dimensional sense array 121 that uses processing device 110 to detect touches on the surface 116.

In one embodiment, the sense array 121 includes electrodes 121(1)-121(N) (where N is a positive integer) that are disposed as a two-dimensional matrix (also referred to as an XY matrix). The sense array 121 is coupled to pins 113(1)-113(N) of the processing device 110 via one or more analog buses 115 transporting multiple signals. In an alternative embodiment without an analog bus, each pin may instead be connected either to a circuit that generates a transmit (TX) signal or to an individual receive (RX) sensor circuit. The capacitive sense array 121 may include a multi-dimension capacitive sense array. The multi-dimension sense array includes multiple sense elements, organized as rows and columns. In another embodiment, the capacitive sense array 121 operates as an all-points-addressable ("APA") mutual capacitive sense array. In another embodiment, the capacitive sense array 121 operates as a coupled-charge receiver. In another embodiment, the capacitive sense array 121 is non-transparent capacitive sense array (e.g., PC touchpad). The capacitive sense array 121 may be disposed to have a flat surface profile. Alternatively, the capacitive sense array 121 may have non-flat surface profiles. Alternatively, other configurations of capacitive sense arrays may be used. For example, instead of vertical columns and horizontal rows, the capacitive sense array 121 may have a hexagon arrangement, or the like, as would be appreciated by one of ordinary skill in the art having the benefit of this disclosure. In one embodiment, the capacitive sense array 121 may be included in an ITO panel or a touch screen panel.

In one embodiment, the capacitance-sensing circuit 101 may include a relaxation oscillator or other means to convert a capacitance into a measured value. The capacitance-sensing circuit 101 may also include a counter or timer to measure the oscillator output. The processing device 110 may further include software components to convert the count value (e.g., capacitance value) into a touch detection decision (also referred to as switch detection decision) or relative magnitude. It should be noted that there are various known methods for measuring capacitance, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should be noted however, instead of evaluating the raw counts relative to a threshold, the capacitance-sensing circuit 101 may be evaluating other measurements to determine the user interaction. For example, in the capacitance-sensing circuit 101 having a sigma-delta modulator, the capacitance-sensing circuit 101 is evaluating the ratio of pulse widths of the output (i.e., density domain), instead of the raw counts being over or under a certain threshold.

In another embodiment, the capacitance-sensing circuit 101 includes a TX signal generator to generate a TX signal to be applied to the TX electrode and a receiver (also referred to as a sensing channel), such as an integrator, coupled to measure an RX signal on the RX electrode. In a further embodiment, the capacitance-sensing circuit includes an analog-to-digital converter (ADC) coupled to an output of the receiver to convert the measured RX signal to a digital value (capacitance value). The digital value can be further processed by the processing device 110, the host 150 or both.

The processing device 110 is configured to detect one or more touches on a touch-sensing device, such as the capacitive sense array 121. The processing device can detect conductive objects, such as touch objects 140 (fingers or passive styluses, an active stylus, or any combination thereof. The capacitance-sensing circuit 101 can measure touch data on the capacitive sense array 121. The touch data may be represented as multiple cells, each cell representing an intersection of sense elements (e.g., electrodes) of the capacitive sense array 121. The capacitive sense elements are electrodes of conductive material, such as copper. The sense elements may also be part of an ITO panel. The capacitive sense elements can be configurable to allow the capacitive-sensing circuit 101 to measure self-capacitance, mutual capacitance, or any combination thereof. In another embodiment, the touch data is a 2D capacitive image of the capacitive sense array 125. In one embodiment, when the capacitance-sensing circuit 101 measures mutual capacitance of the touch-sensing device (e.g., capacitive sense array 121), the capacitance-sensing circuit 101 obtains a 2D capacitive image of the touch-sensing device and processes the data for peaks and positional information. In another embodiment, the processing device 110 is a microcontroller that obtains a capacitance touch signal data set, such as from a sense array, and finger detection firmware executing on the microcontroller identifies data set areas that indicate touches, detects and processes peaks, calculates the coordinates, or any combination therefore. The firmware identifies the peaks using the embodiments described herein. The firmware can calculate a precise coordinate for the resulting peaks. In one embodiment, the firmware can calculate the precise coordinates for the resulting peaks using a centroid algorithm, which calculates a centroid of the touch, the centroid being a center of mass of the touch. The centroid may be an X/Y coordinate of the touch. Alternatively, other coordinate interpolation algorithms may be used to determine the coordinates of the resulting peaks. The microcontroller can report the precise coordinates to a host processor, as well as other information.

In one embodiment, the processing device 110 further includes processing logic 102. Operations of the processing logic 102 may be implemented in firmware; alternatively, they may be implemented in hardware or software. The processing logic 102 may receive signals from the capacitance-sensing circuit 101, and determine the state of the sense array 121, such as whether an object (e.g., a finger) is detected on or in proximity to the sense array 121 (e.g., determining the presence of the object), resolve where the object is on the sense array (e.g., determining the location of the object), tracking the motion of the object, or other information related to an object detected at the touch sensor.

In another embodiment, instead of performing the operations of the processing logic 102 in the processing device 110, the processing device 110 may send the raw data or partially-processed data to the host 150. The host 150, as illustrated in FIG. 1, may include decision logic 151 that performs some or all of the operations of the processing logic 102. Operations of the decision logic 151 may be implemented in firmware, hardware, software, or a combination thereof. The host 150 may include a high-level Application Programming Interface (API) in applications 152 that perform routines on the received data, such as compensating for sensitivity differences, other compensation algorithms, baseline update routines, start-up and/or initialization routines, interpolation operations, or scaling operations. The operations described with respect to the processing logic 102 may be implemented in the decision logic 151, the applications 152, or in other hardware, software, and/or firmware external to the processing device 110. In some other embodiments, the processing device 110 is the host 150.

In another embodiment, the processing device 110 may also include a non-sensing actions block 103. This block 103 may be used to process and/or receive/transmit data to and from the host 150. For example, additional components may be implemented to operate with the processing device 110 along with the sense array 121 (e.g., keyboard, keypad, mouse, trackball, LEDs, displays, or other peripheral devices).

As illustrated, capacitance-sensing circuit 101 may be integrated into processing device 110. Capacitance-sensing circuit 101 may include analog I/O for coupling to an external component, such as touch-sensor pad (not shown), capacitive sense array 121, touch-sensor slider (not shown), touch-sensor buttons (not shown), and/or other devices. The capacitance-sensing circuit 101 may be configurable to measure capacitance using mutual-capacitance sensing techniques, self-capacitance sensing technique, charge coupling techniques or the like. In one embodiment, capacitance-sensing circuit 101 operates using a charge accumulation circuit, a capacitance modulation circuit, or other capacitance sensing methods known by those skilled in the art. In an embodiment, the capacitance-sensing circuit 101 is of the Cypress TMA-3xx, TMA-4xx, or TMA-xx families of touch screen controllers. Alternatively, other capacitance-sensing circuits may be used. The mutual capacitive sense arrays, or touch screens, as described herein, may include a transparent, conductive sense array disposed on, in, or under either a visual display itself (e.g. LCD monitor), or a transparent substrate in front of the display. In an embodiment, the TX and RX electrodes are configured in rows and columns, respectively. It should be noted that the rows and columns of electrodes can be configured as TX or RX electrodes by the capacitance-sensing circuit 101 in any chosen combination. In one embodiment, the TX and RX electrodes of the sense array 125 are configurable to operate as a TX and RX electrodes of a mutual capacitive sense array in a first mode to detect touch objects, and to operate as electrodes of a coupled-charge receiver in a second mode to detect a stylus on the same electrodes of the sense array. The stylus, which generates a stylus TX signal when activated, is used to couple charge to the capacitive sense array, instead of measuring a mutual capacitance at an intersection of a RX electrode and a TX electrode (including one or more sense element) as done during mutual-capacitance sensing. An intersection between two sense elements may be understood as a location at which one sense electrode crosses over or overlaps another, while maintaining galvanic isolation from each other. The capacitance-sensing circuit 101 does not use mutual-capacitance or self-capacitance sensing to measure capacitances of the sense elements when performing a stylus sensing. Rather, the capacitance-sensing circuit 101 measures a charge that is capacitively coupled between the sense array 121 and the stylus as described herein. The capacitance associated with the intersection between a TX electrode and an RX electrode can be sensed by selecting every available combination of TX electrode and RX electrode. When a touch object, such as a finger or stylus, approaches the capacitive sense array 121, the object causes a decrease in mutual capacitance between some of the TX/RX electrodes. In another embodiment, the presence of a finger increases the coupling capacitance of the electrodes. Thus, the location of the finger on the capacitive sense array 121 can be determined by identifying the RX electrode having a decreased coupling capacitance between the RX electrode and the TX electrode to which the TX signal was applied at the time the decreased capacitance was measured on the RX electrode. Therefore, by sequentially determining the capacitances associated with the intersection of electrodes, the locations of one or more inputs can be determined. It should be noted that the process can calibrate the sense elements (intersections of RX and TX electrodes) by determining baselines for the sense elements. It should also be noted that interpolation may be used to detect finger position at better resolutions than the row/column pitch as would be appreciated by one of ordinary skill in the art having the benefit of this disclosure. In addition, various types of coordinate interpolation algorithms may be used to detect the center of the touch as would be appreciated by one of ordinary skill in the art having the benefit of this disclosure.

It should also be noted that the embodiments described herein are not limited to having a configuration of a processing device coupled to a host, but may include a system that measures the capacitance on the sensing device and sends the raw data to a host computer where it is analyzed by an application. In effect, the processing that is done by processing device 110 may also be done in the host.

The processing device 110 may reside on a common carrier substrate such as, for example, an integrated circuit (IC) die substrate, or a multi-chip module substrate. Alternatively, the components of the processing device 110 may be one or more separate integrated circuits and/or discrete components. In one embodiment, the processing device 110 may be the Programmable System on a Chip (PSoC®) processing device, developed by Cypress Semiconductor Corporation, San Jose, Calif. Alternatively, the processing device 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or other programmable device. In an alternative embodiment, for example, the processing device 110 may be a network processor having multiple processors including a core unit and multiple micro-engines. Additionally, the processing device 110 may include any combination of general-purpose processing device(s) and special-purpose processing device(s).

Capacitance-sensing circuit 101 may be integrated into the IC of the processing device 110, or alternatively, in a separate IC. Alternatively, descriptions of capacitance-sensing circuit 101 may be generated and compiled for incorporation into other integrated circuits. For example, behavioral level code describing the capacitance-sensing circuit 101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe capacitance-sensing circuit 101.

It should be noted that the components of electronic system 100 may include all the components described above. Alternatively, electronic system 100 may include some of the components described above.

In one embodiment, the electronic system 100 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, an eBook reader, global position system ("GPS") or a control panel. The embodiments described herein are not limited to touch screens or touch-sensor pads for notebook implementations, but can be used in other capacitive sensing implementations, for example, the sensing device may be a touch-sensor slider (not shown) or touch-sensor buttons (e.g., capacitance sensing buttons). In one embodiment, these sensing devices include one or more capacitive sensors or other types of capacitance-sensing circuitry. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition, and numeric keypad operation.

Figure 2:
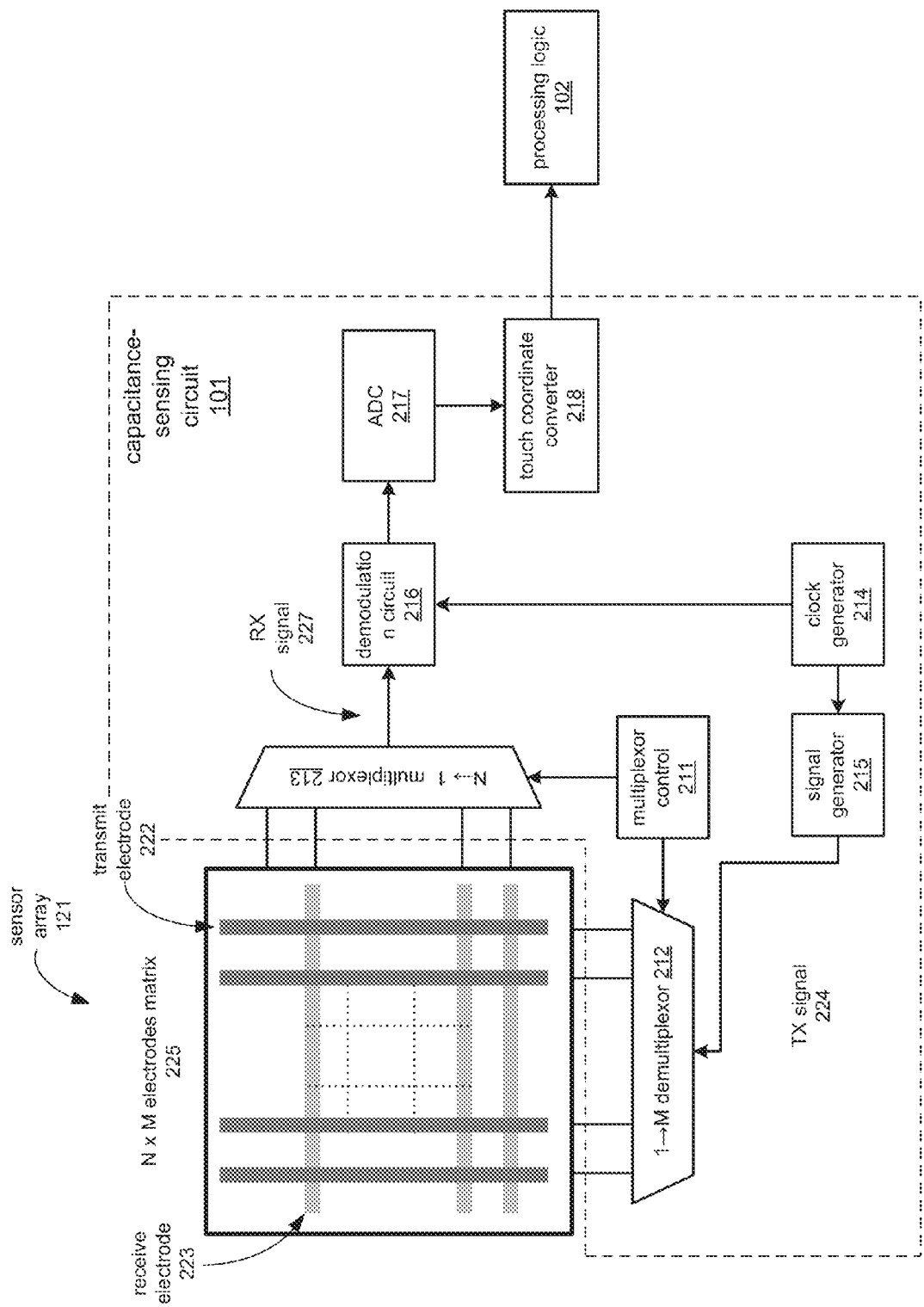
FIG. 2 is a block diagram illustrating an embodiment of an electronic system that processed touch data.

FIG. 2 is a block diagram illustrating one embodiment of sense array 121 composed of orthogonal electrodes and a capacitance-sensing circuit 101 that converts changes in measured capacitances to coordinates indicating the presence and location of touch. In one embodiment, the capacitance-sensing circuit 101 may measure mutual capacitances for intersections between the transmit and receive electrodes in the sense array 121. The touch coordinates are calculated based on changes in the measured capacitances relative to the capacitances of the same touch sense array 121 in an untouched state. In one embodiment, sense array 121 and capacitance-sensing circuit 101 are implemented in a system such as electronic system 100. Sense array 121 includes a matrix 225 of N×M electrodes (N receive electrodes and M transmit electrodes), which further includes transmit (TX) electrode 222 and receive (RX) electrode 223. Each of the electrodes in matrix 225 is connected with capacitance sensing circuit 101 through demultiplexer 212 and multiplexer 213.

Capacitance-sensing circuit 101 includes multiplexer control 211, demultiplexer 212, multiplexer 213, clock generator 214, signal generator 215, demodulation circuit 216, and analog to digital converter (ADC) 217. ADC 217 is further coupled with touch coordinate converter 218. Touch coordinate converter 218 may be implemented in the processing logic 102.

The transmit and receive electrodes in the electrode matrix 225 may be arranged so that each of the transmit electrodes overlap and cross each of the receive electrodes such as to form an array of intersections, while maintaining galvanic isolation from each other. Thus, each transmit electrode may be capacitively coupled with each of the receive electrodes. For example, transmit electrode 222 is capacitively coupled with receive electrode 223 at the point where transmit electrode 222 and receive electrode 223 overlap.

Clock generator 214 supplies a clock signal to signal generator 215, which produces a TX signal 224 to be supplied to the transmit electrodes of touch sense array 121. In one embodiment, the signal generator 215 includes a set of switches that operate according to the clock signal from clock generator 214. The switches may generate a TX signal 224 by periodically connecting the output of signal generator 215 to a first voltage and then to a second voltage, wherein said first and second voltages are different.

The output of signal generator 215 is connected with demultiplexer 212, which allows the TX signal 224 to be applied to any of the M transmit electrodes of sense array 121. In one embodiment, multiplexer control 211 controls demultiplexer 212 so that the TX signal 224 is applied to each transmit electrode 222 in a controlled sequence. Demultiplexer 212 may also be used to ground, float, or connect an alternate signal to the other transmit electrodes to which the TX signal 224 is not currently being applied. In an alternate embodiment the TX signal 224 may be presented in a true form to a subset of the transmit electrodes 222 and in complement form to a second subset of the transmit electrodes 222, wherein there is no overlap in members of the first and second subset of transmit electrodes 222.

Because of the capacitive coupling between the transmit and receive electrodes, the TX signal 224 applied to each transmit electrode induces a current within each of the receive electrodes. For instance, when the TX signal 224 is applied to transmit electrode 222 through demultiplexer 212, the TX signal 224 induces an RX signal 227 on the receive electrodes in matrix 225. The RX signal 227 on each of the receive electrodes can then be measured in sequence by using multiplexer 213 to connect each of the N receive electrodes to demodulation circuit 216 in sequence.

The mutual capacitance associated with the intersections of all TX electrodes and RX electrodes can be measured by selecting every available combination of TX electrode and an RX electrode using demultiplexer 212 and multiplexer 213. To improve performance, multiplexer 213 may also be segmented to allow more than one of the receive electrodes in matrix 225 to be routed to additional demodulation circuits 216. In an optimized configuration, wherein there is a 1-to-1 correspondence of instances of demodulation circuit 216 with receive electrodes, multiplexer 213 may not be present in the system.

When a conductive object, such as a finger, approaches the electrode matrix 225, the object causes a decrease in the measured mutual capacitance between only some of the electrodes. For example, if a finger is placed near the intersection of transmit electrode 222 and receive electrode 223, the presence of the finger will decrease the charge coupled between electrodes 222 and 223. Thus, the location of the finger on the touchpad can be determined by identifying the one or more receive electrodes having a decrease in measured mutual capacitance in addition to identifying the transmit electrode to which the TX signal 224 was applied at the time the decrease in capacitance was measured on the one or more receive electrodes.

By determining changes in the mutual capacitances associated with each intersection of electrodes in the matrix 225, the presence and locations of one or more conductive objects may be determined. The determination may be sequential, in parallel, or may occur more frequently at commonly used electrodes.

In alternative embodiments, other methods for detecting the presence of a finger or other conductive object may be used where the finger or conductive object causes an increase in measured capacitance at one or more electrodes, which may be arranged in a grid or other pattern. For example, a finger placed near an electrode of a capacitive sensor may introduce an additional capacitance to ground that increases the total capacitance between the electrode and ground. The location of the finger can be determined based on the locations of one or more electrodes at which a change in measured capacitance is detected, and the associated magnitude of capacitance change at each respective electrode.

The induced current signal 227 is integrated by demodulation circuit 216. The rectified current output by demodulation circuit 216 can then be filtered and converted to a digital code by ADC 217.

A series of such digital codes measured from adjacent sensor intersections, when compared to or offset by the associated codes of these same sensors in an un-touched state, may be converted to touch coordinates indicating a position of an input on touch sense array 121 by touch coordinate converter 218. The touch coordinates may then be used to detect gestures or perform other functions by the processing logic 102.

Figure 3:
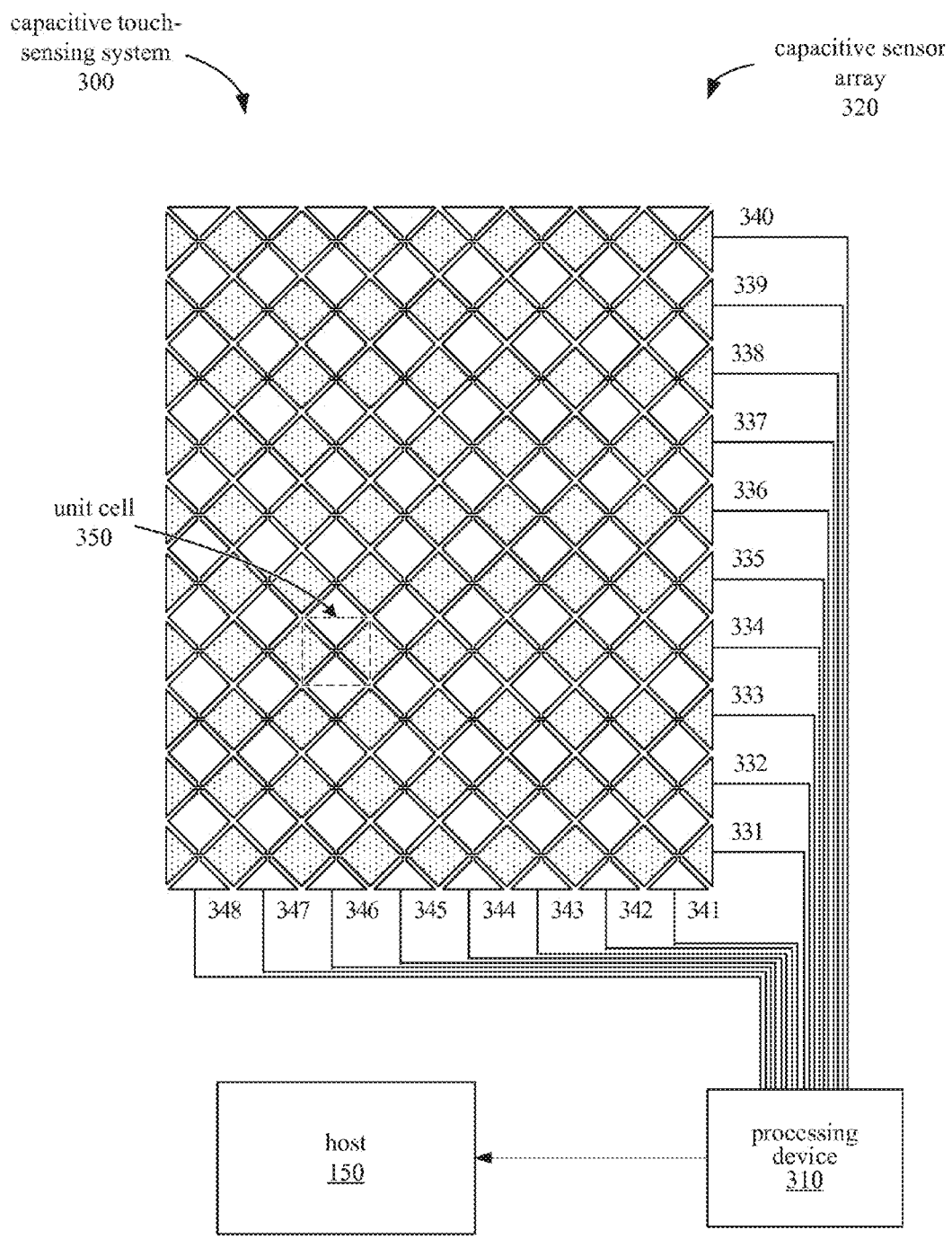
FIG. 3 illustrates an embodiment of a capacitive-sense array having a single solid diamond (SSD) pattern.

FIG. 3 illustrates an embodiment of a capacitive touch-sensing system 300 that includes a capacitive-sense array 320. Capacitive-sense array 320 includes multiple row electrodes 331-340 and multiple column electrodes 341-348. The row and column electrodes 331-348 are connected to a processing device 310, which may include the functionality of capacitance-sensing circuit 101, as illustrated in FIG. 2. In one embodiment, the processing device 310 may perform mutual capacitance measurement scans of the capacitive-sense array 320 to measure a mutual capacitance value associated with each of the intersections between a row electrode and a column electrode in the sense array 320. The measured capacitances may be further processed to determine centroid locations of one or more contacts of conductive objects proximate to the capacitive-sense array 320.

In one embodiment, the processing device 310 is connected to a host 150 which may receive the measured capacitances or calculated centroid locations from the processing device 310.

The capacitive-sense array 320 illustrated in FIG. 3 includes electrodes arranged to create a pattern of interconnected diamond shapes. Specifically, the electrodes 331-348 of sense array 320 form a single solid diamond (SSD) pattern. In one embodiment, each intersection between a row electrode and a column electrode defines a unit cell. Each point within the unit cell is closer to the associated intersection than to any other intersection. For example, unit cell 350 contains the points that are closest to the intersection between row electrode 334 and column electrode 346.

In one embodiment, a capacitive touch-sensing system may collect data from the entire touch-sensing surface by performing a scan to measure capacitances of the unit cells that comprise the touch-sensing surface, then process the data serially or in parallel with a subsequent scan. For example, one system that processes data serially may collect raw capacitance data from each unit cell of the entire touch-sensing surface, and filter the raw data. Based on the filtered raw data, the system may determine local maxima (corresponding to local maximum changes in capacitance) to calculate positions of fingers or other conductive objects, then perform post processing of the resolved positions to report locations of the conductive objects, or to perform other functions such as motion tracking or gesture recognition.

In one embodiment, a touch-sensing system may be configured to perform one or both of self-capacitance sensing and mutual capacitance sensing. One embodiment of a capacitive touch-sensing system that is configured to perform self-capacitance sensing may, in sequence or in parallel, measure the self-capacitance of each row and column electrode of the touch-sensing surface, such that the total number of sense operations is N+M, for a capacitive-sense array having N rows and M columns. In one embodiment, the touch-sensing system may be capable of connecting individual electrodes together to be sensed in parallel with a single operation. For example, multiple row and or column electrodes may be coupled together and sensed in a single operation to determine whether a conductive object is touching or near the touch-sensing surface. In an alternate embodiment, the touch-sensing system may be capable of connecting each row electrode to it is own sensing circuit such that all row electrodes may be sensed in parallel with a single operation. The touch-sensing system may also be capable of connecting each column electrode to its own sensing circuit such that all column electrodes may be sensed in parallel with a single operation. The touch-sensing system may also be capable of connecting all row and column electrodes to their own sensing circuits, such that all row and column electrodes may be sensed in parallel with a single operation.

In one embodiment, a touch-sensing system may perform mutual capacitance sensing of the touch-sensing surface by individually sensing each intersection between a row electrode and a column electrode. Thus, a total number of sense operations for a capacitive-sense array having X rows and Y columns is X×Y. In one embodiment, performing a mutual capacitance measurement of a unit cell formed at the intersection of a row electrode and a column electrode includes applying a signal (TX) to one electrode and measuring characteristics of the signal on another electrode resulting from the capacitive coupling between the electrodes.

In one embodiment, multiple capacitance sensing circuits may be used in parallel to measure a signal coupled to multiple column electrodes simultaneously, from a signal applied to one or more row electrodes. In one embodiment, for a capacitive-sense array having X rows, Y columns, and N columns that can be sensed simultaneously, the number of mutual capacitance sensing operations is the smallest whole number greater than or equal to X×Y/N.

In one embodiment, each update of the touch locations may include a sensing portion and a non-sensing portion. The sensing portion may include measurement of capacitance associated with intersections between electrodes, while the non-sensing portion may include calculation of touch locations based on the capacitance measurements and reporting of the calculated touch locations to a host device.

Spatial accuracy of a passive stylus with existing sensor cells (also referred to as a unit cell or intersection of a pair of electrodes) is limited because of low signals in the sensor cell under the passive stylus (cells i−1, i and i+1). Because of low sensitivity, it is challenging to use a passive stylus for hand writing in a small screen on a device, such as a 10×15 mm box on a screen.

Good positional accuracy of the stylus' reported position is needed for handwriting recognition by the sense array. Some handwriting requires that there be no more than 0.5 mm positional error in the presence of noise. The two-dimensional (2D) measurement method is very helpful to combat the charger noise, but it can be used only with sensor cells which have symmetric capacitances Cf-rx and Cf-tx.

Figure 4:
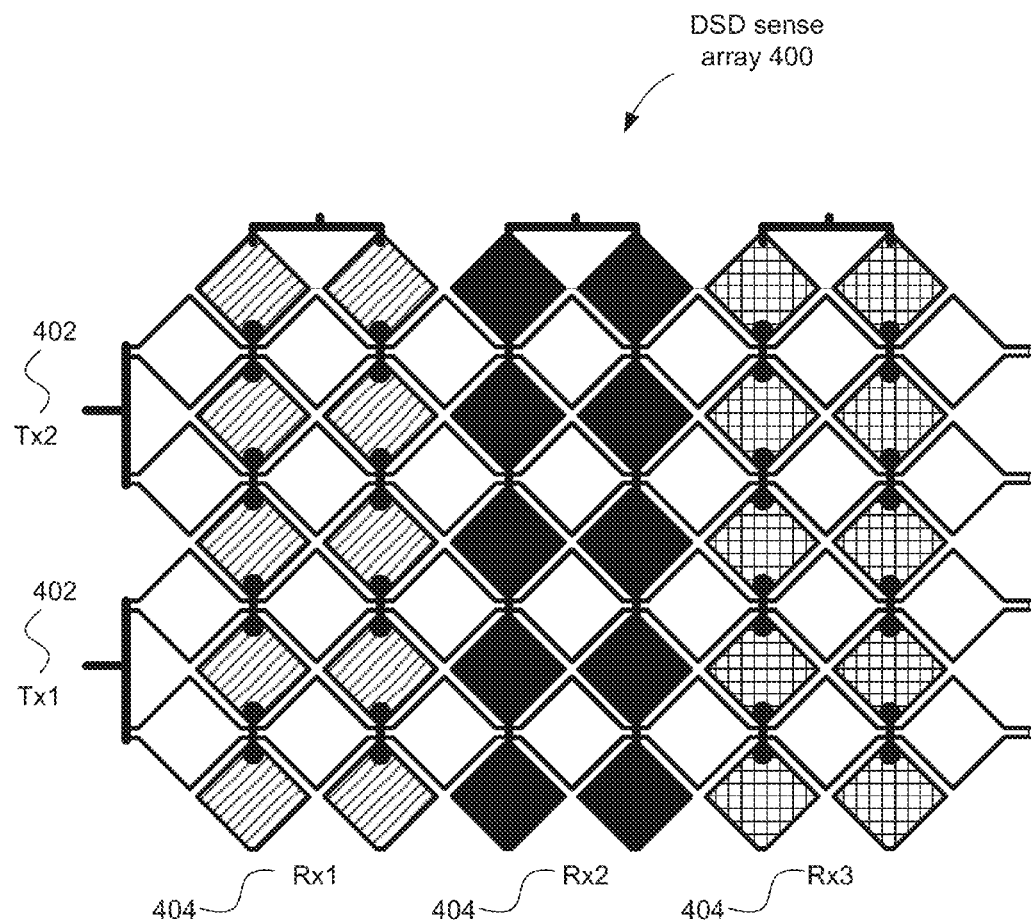
FIG. 4 illustrates an embodiment of a capacitive-sense array having a double solid diamond (DSD) pattern.

Achieving good accuracy is challenging when the sensor pitch is wider than the stylus tip. FIG. 4 illustrates an embodiment of a capacitive-sense array 400 having a double solid diamond (DSD) pattern. The DSD sensor cells of the DSD pattern may have a sensor pitch of 4 mm. This sensor cell features electrodes built of diamond shape sense elements. Typically, row electrodes 402 in one direction are linked with indium tin oxide (ITO) necks in the same layer, while column electrodes 404 are linked by bridges (jumpers). When a typical stylus (e.g., 2 mm stylus) is moved above the sensor unit cell in the x direction, it produces the signal profile shown in FIG. 5.

Figure 5:
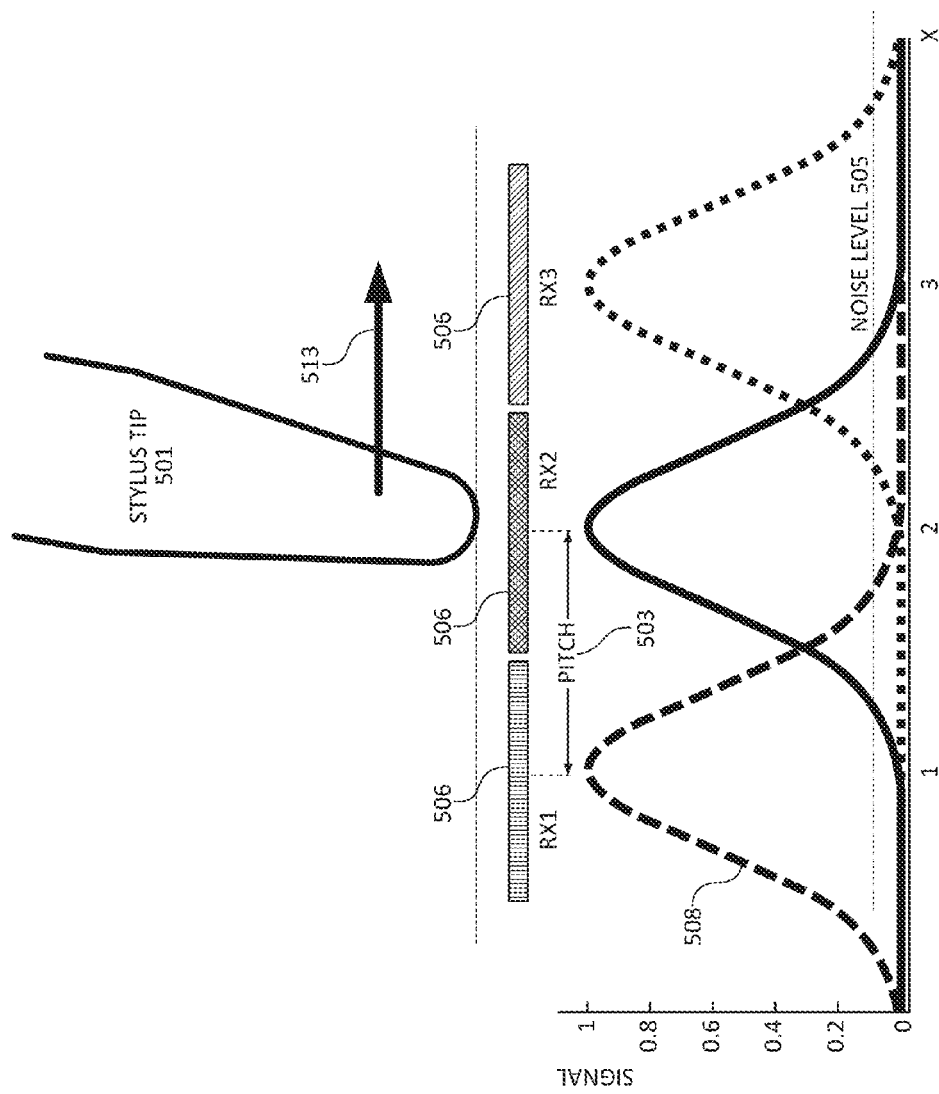
FIG. 5 illustrates a cross section view of three unit cells and corresponding capacitance profiles of the capacitive-sense array of FIG. 4 according to one embodiment.

FIG. 5 illustrates a cross section view of three unit cells and corresponding capacitance profiles of the capacitive-sense array of FIG. 4 according to one embodiment. When a stylus tip 501 moves over the three unit cells 506 in the x direction 513, the unit cells 506 produce a signal profile 508. A maximum signal is observed when the stylus 501 is above a center of the unit cell 506. The signal descends fast while stylus 501 is moved away from the center of the electrode. When the signal strength falls below a noise level 505, these signals cannot be used for position calculation. When there are not enough signals for centroid algorithm, such as when there are less than three signals, the position of the stylus 510 cannot be calculated. It is said that there is a "dead zone" on the unit cell. The sensor width of the unit cells (width of the electrode plus a gap between the adjacent electrode) is equal or less than a sensor pitch 503 of the sense array. The sensor pitch 503 can be measured between a center of one unit cell and a center of an adjacent unit cell. Instead of being measured from centers of unit cells, the sensor pitch 503 can also be measured from one edge of an electrode to the same edge of the adjacent electrode to include the width of the electrode and the gap between the electrodes.

Figure 7:
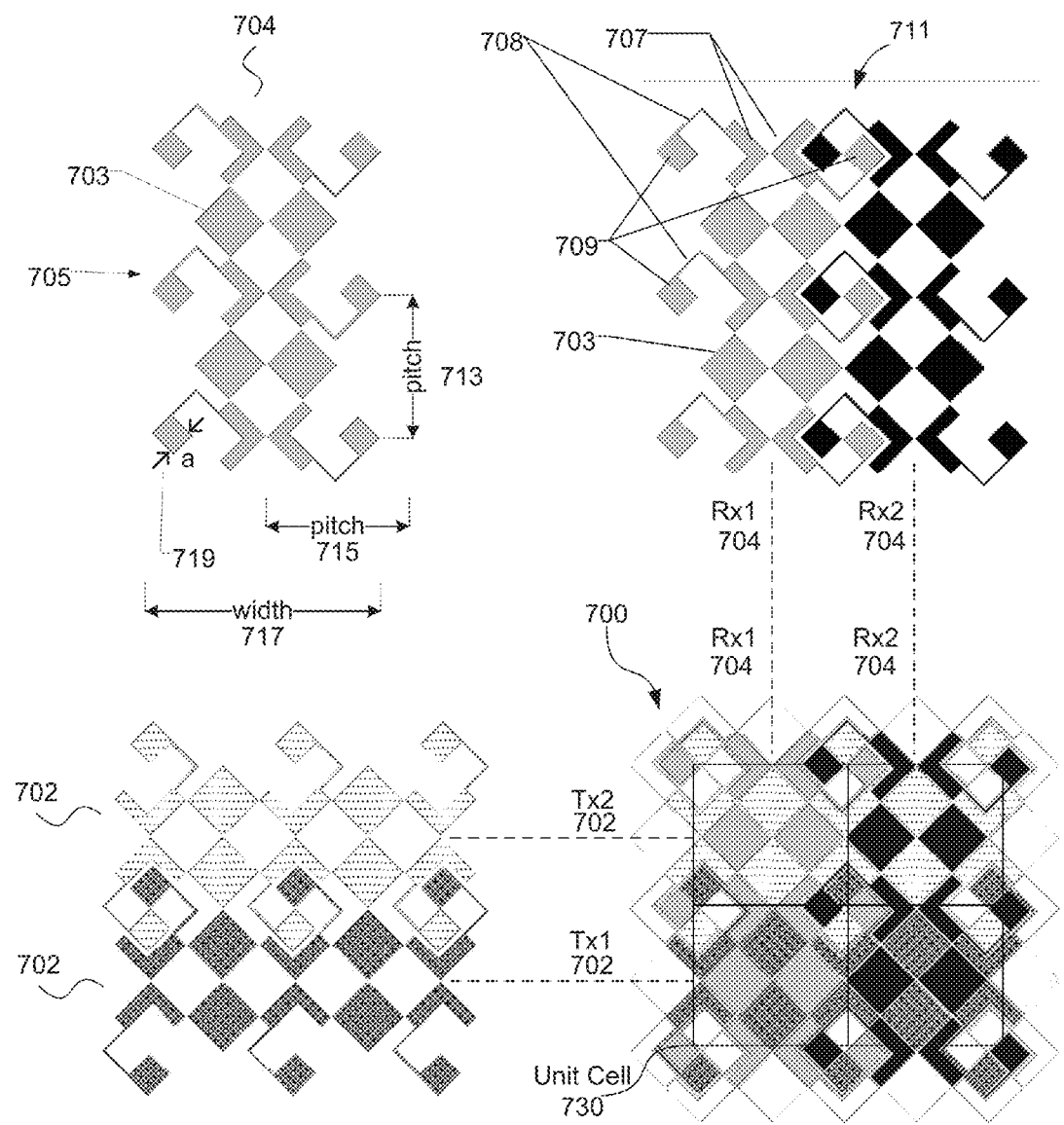
FIG. 7 illustrates an embodiment of a capacitive-sense array having a DSD pattern with interleaving sense elements according to one embodiment.

The embodiments described herein are directed to unit cells that include interleaving sense elements. An electrode can be made up of tessellated sense elements having different shapes, such as rows and columns of solid diamond sense elements. The sense elements are coupled together in rows or columns (e.g., single solid diamond (SSD) pattern) or in multiple rows and multiple columns (e.g., double solid diamond (DSD) pattern). In the embodiments described herein, one or more of the sense elements are interleaving elements that interleave portions of other electrodes. For example, a column electrode may include some diamond shape sense elements and some interleaving sense elements that interleave with other interleaving sense elements of an adjacent column electrode, as illustrated in FIG. 7. As illustrated in FIG. 7, the diamond sense elements alternate with the interleaving sense elements.

In another embodiment, a capacitive-sense array includes a first electrode and a second electrode disposed adjacent to the first electrode in a first axis. The first electrode includes a first sense element comprising a first shape and a first interleaving sense element that interleaves with a first portion and a second portion of the second electrode to extend a first dimension (width or height) of the first electrode to be greater than a sensor pitch in the first axis. The first sense element and the first interleaving sense element have the same surface area. In another embodiment, an area defined by a maximum width of the first electrode and a maximum of height of the first electrode is at least two times a product of the first dimension and the second dimension. The first interleaving sense element may include a base portion and an extended portion coupled to the base portion via a connecting line. The extended portion can be disposed to interleave with the other portions of the second electrode. The surface area of the base portion and extended portion has the same surface area as the first sense element. In some embodiments, the shapes of the base portion and extended portion are such that they would form the same shape as the first sense electrode if connected. For example, as illustrated in FIG. 7, the extended portion is a diamond shape and the base portion has an L-shape or a reverse L-shape and the connecting line couples the diamond shape and the L-shape or reverse L-shape.

In a further embodiment, the sense array includes the second electrode that includes a second sense element with the same shape as the first sense element and a second interleaving sense element that interleaves with a first portion and a second portion of the first interleaving sense element to extend a second dimension of the second electrode to be greater than the sensor pitch in the first axis. The second dimension may be greater than the sensor pitch in the first axis by two or more. In further embodiments, the first electrode includes two columns or two rows of first sense elements and first interleaving sense elements. The first electrode and the second electrode may be part of a first set of electrodes that are disposed in a first axis and a second set of electrodes are disposed in a second axis. One of the second set of electrodes can include a third sense element and a third interleaving sense element that interleaves with a first portion and a second portion of another one of the second set to extend a third dimension of one electrode to be greater than a second sensor pitch of the sense array in the second axis. The second sensor pitch can be the same or different than the sensor pitch in the first axis. The third dimension may be greater than the sensor pitch in the second axis by two or more. The first set of electrodes and the second set of electrodes can be disposed to form multiple unit cells each corresponding to an intersection of a pair of electrodes including one electrode from the first set and one electrode from the second set.

In one embodiment, the first set of electrodes is a modified DSD pattern including a first line of interconnected electrodes including first diamond shape elements and first interleaving elements that interleave with portions of the second electrode on a first side and a second line of interconnected electrodes including second diamond shape elements and second interleaving elements that interleave with portions of a third electrode on a second side, as illustrated in FIG. 7.

In another embodiment, the first electrode and the second electrode are part of a first set of electrodes in the first axis and a second set of electrode disposed in the second axis. In some embodiments, the first set of electrode and the second set of electrodes are disposed in a single layer, such as illustrated in the embodiments of FIGS. 10-13. FIG. 10 illustrates various embodiments of the first and second sets of electrodes form a swirl region used for interleaving in the single layer. For example, the swirl region can be a square swirl region, a triangle swirl region, a sector swirl region, or the like.

The embodiments described herein can provide an improved touchscreen by improving sensitivity of measurements for sensing touch objects and by providing better positional accuracy, especially for styli. The embodiments described herein can enable a touchscreen of a device, such as a tablet, to operate precisely with a passive stylus, as well as continue to operate with fingers or other conductive objects. The embodiments describe herein can be more stylus-friendly than regular sensor arrays, allowing positions of the stylus to be determined with greater accuracy. The interleaving sense elements turn the electrodes into interleaved electrodes that have a greater dimension (width or height) than the sensor pitch. The embodiments described herein can permit detecting positions of narrow touch objects. For example, a narrow touch object may be a 1.7 mm stylus or a 2 mm stylus and a regular touch object may be 7 mm or larger.

Figure 6:
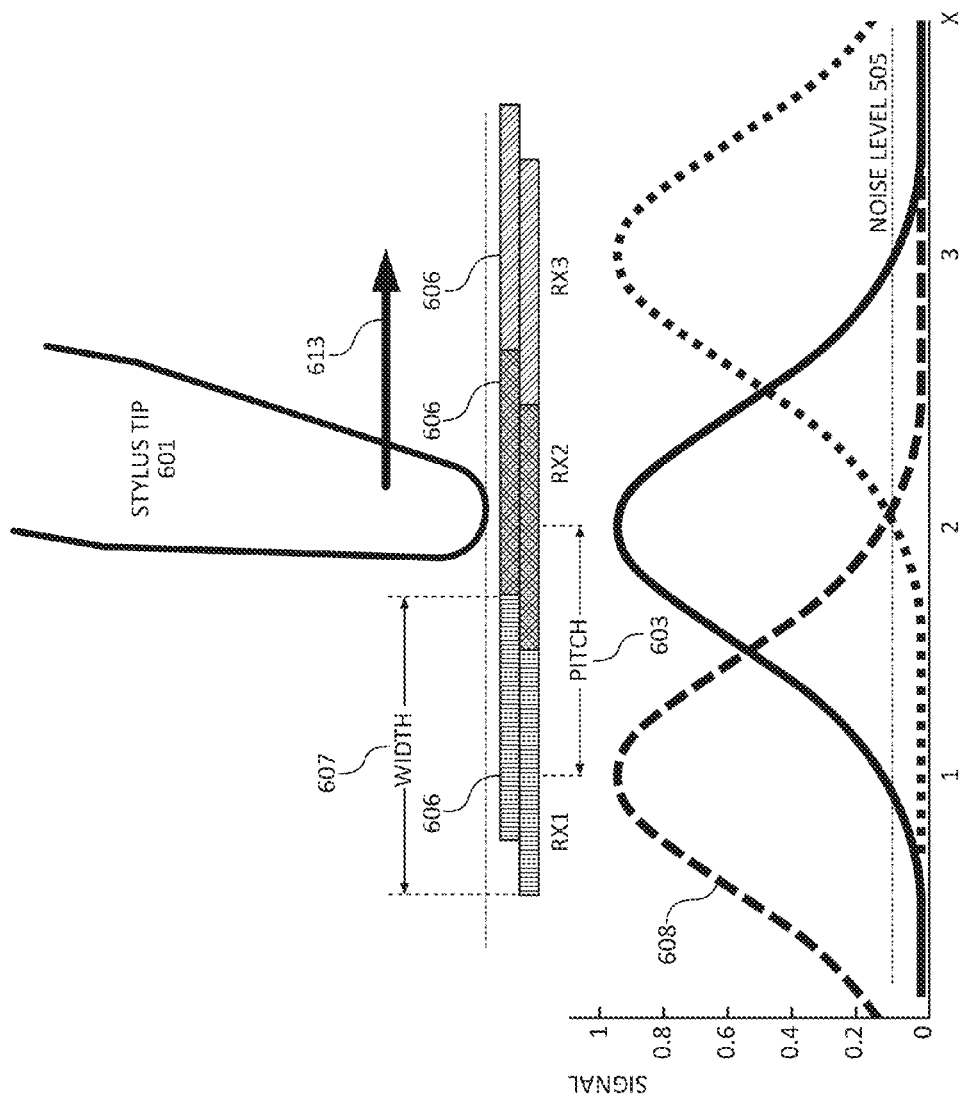
FIG. 6 illustrates a cross section view of three unit cells and corresponding capacitance profiles of the capacitive-sense array with interleaving sense elements according to one embodiment.

FIG. 6 illustrates a cross section view of three unit cells and corresponding capacitance profiles of the capacitive-sense array with interleaving sense elements according to one embodiment. When a stylus tip 601 moves over the three unit cells 606 in the x direction 613, the unit cells 606 produce a signal profile 608. A maximum signal is observed when the stylus 601 is above a center of the unit cell 606. The capacitive-sense array with interleaving sense elements of FIG. 6 makes the signal profile 608 wider (e.g., dCm profile). Unlike the signal profile 508, the signal profile 608 does not descend as fast while the stylus 601 is moved away from the center of the electrode. The interleaved electrodes are physically wider than the sensor pitch 603 of the capacitive-sense array. In particular, a unit cell can have a width 607 that is greater than the sensor pitch 603. In some embodiments, the width 607 is greater than the sensor pitch 603 by two or more times. Due to wider electrodes, the stylus 601 can be sensed at wider span in that dimension (e.g., x coordinate). As a result, the signal profile 608 (dCm profile) is wider comparing to signal profile 508 (dCm profile) in the regular unit cell in FIG. 5. Provided the same sensor pitch, wider signal profile (dCm profiles) from the adjacent electrodes Rx1 and Rx3 are crossing at higher point than they do in FIG. 5. As a result, all three signals are above the noise level 605 at the point of crossing of the signal (dCm) from Rx2 with the signals (dCm) from Rx1 and Rx3. The sensor cell of FIG. 6 does not have a dead zone at this noise level 605. As described above, sensor pitch 603 can be measured between a center of one unit cell and a center of an adjacent unit cell. Instead of being measured from centers of unit cells, the sensor pitch 603 can also be measured from one edge of an electrode to the same edge of the adjacent electrode to include the width of the electrode and the gap between the electrodes. However, as illustrated graphically in FIG. 6, the electrodes have interleaving sense elements that interleave with portions of adjacent electrodes to create an electrode that is wider than the sensor pitch 603.

The embodiments described below are directed to various patterns of interleaving electrodes.

FIG. 7 illustrates an embodiment of a capacitive-sense array 700 having a DSD pattern with interleaving sense elements 701 according to one embodiment. The depicted capacitive-sense array 700 includes two row electrodes 702 and two column electrodes. FIG. 7 illustrates a single column electrode 704 in the top-left view, two column electrodes 704 in the top-right view, two row electrodes 702 in the bottom-left view, and the combined capacitive-sense array 700 of the two column electrodes 704 and two row electrodes 702 in the bottom-right view. Each electrode, as illustrated in the top left view of the column electrode 702, includes two lines of tessellated sense elements. The tessellated sense elements include alternating diamond sense elements 703 and interleaving sense element 705. Each interleaving sense element 705 includes a base portion 707 and an extended portion 709 coupled to the base portion 707 via a connecting line 708. In this embodiment, the extended portion 709 has a smaller diamond shape than the diamond shape of the diamond sense elements 703. The extended portion 709 is disposed to interleave with the extended portion 709 of an adjacent electrode, as illustrated in the top right view of the two column electrodes 704. The interleaving sense elements 705 from adjacent electrodes form an interleaving region 711. The interleaving region 711 can be considered a swirl region, as described herein. The interleaving region 711 of the capacitive-sense array 700 can permit the row electrodes 702 to be disposed in a single layer with the column electrodes 704 without any additional bridges or jumpers. The capacitive-sense array 700 can be used for 2D sensing methods. The intersections of the row electrodes 702 and the column electrodes 704 define unit cells 730. Each point within the unit cell 730 is closer to the associated intersection than to any other intersection. The unit cell 730 is a functional unit cell where a capacitance between a pair of electrodes can be measured and represented as a digital value. The electrodes can also be considered geometric unit cells in which the geometric unit cell is a unit of a repeatable pattern or tessellations.

In this embodiment, the capacitive-sense array 700 has a pitch 713 in a y-axis and a pitch 715 in an x-axis. The pitches 713 and 715 may be the same pitch or different pitches. The electrodes have a width 717, as illustrated in the column electrode 704. The width 717 is greater than the pitch 715. In other embodiments, other dimensions of the electrodes can be used than widths, such as heights. For example, the row electrode 702 can have a height (not labeled) that is greater than the pitch 713. In one embodiment, the pitch 715 is 4 mm. Alternatively, other dimensions may be used. The extended portion 709 has a dimension a 719 (labeled a. Dimension 719 can be various sizes between 0.05 mm to 0.95 mm for the pitch 715 of 4 mm. In one embodiment, the dimension 719 is 0.75 mm.

In this embodiment, the capacitive-sense array 700 is a modified DSD pattern in which interleaving sense elements (e.g., extended portions 709) penetrate adjacent electrodes. Shapes can be made in base portions 707 of the adjacent electrodes to interleave with the extended portions 709. In this embodiment, every other one of the diamond sense elements is formed into interleaving sense elements. In other embodiments, other alternating schemes or non-alternating schemes may be used for the interleaving sense elements. In the depicted embodiment, the row electrodes 702 and the column electrodes 704 are identical, but disposed on two different axes. In other embodiments, the row electrodes 702 and the column electrodes 704 may differ in shape and size from one another.

Figure 8:
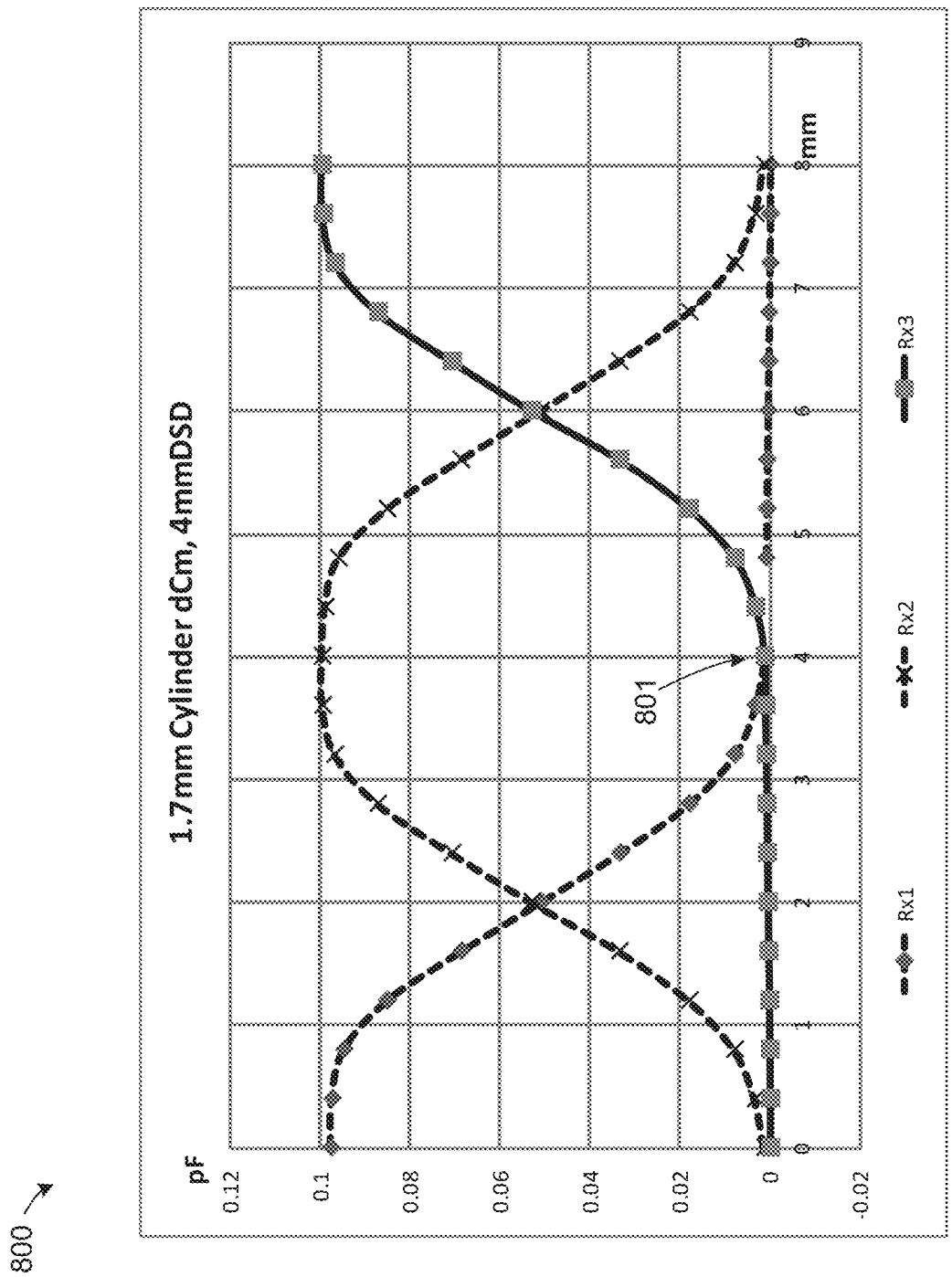
FIG. 8 is a waveform diagram illustrating a signal response of the capacitive-sense array of FIG. 4 according to one embodiment.
Figure 9:
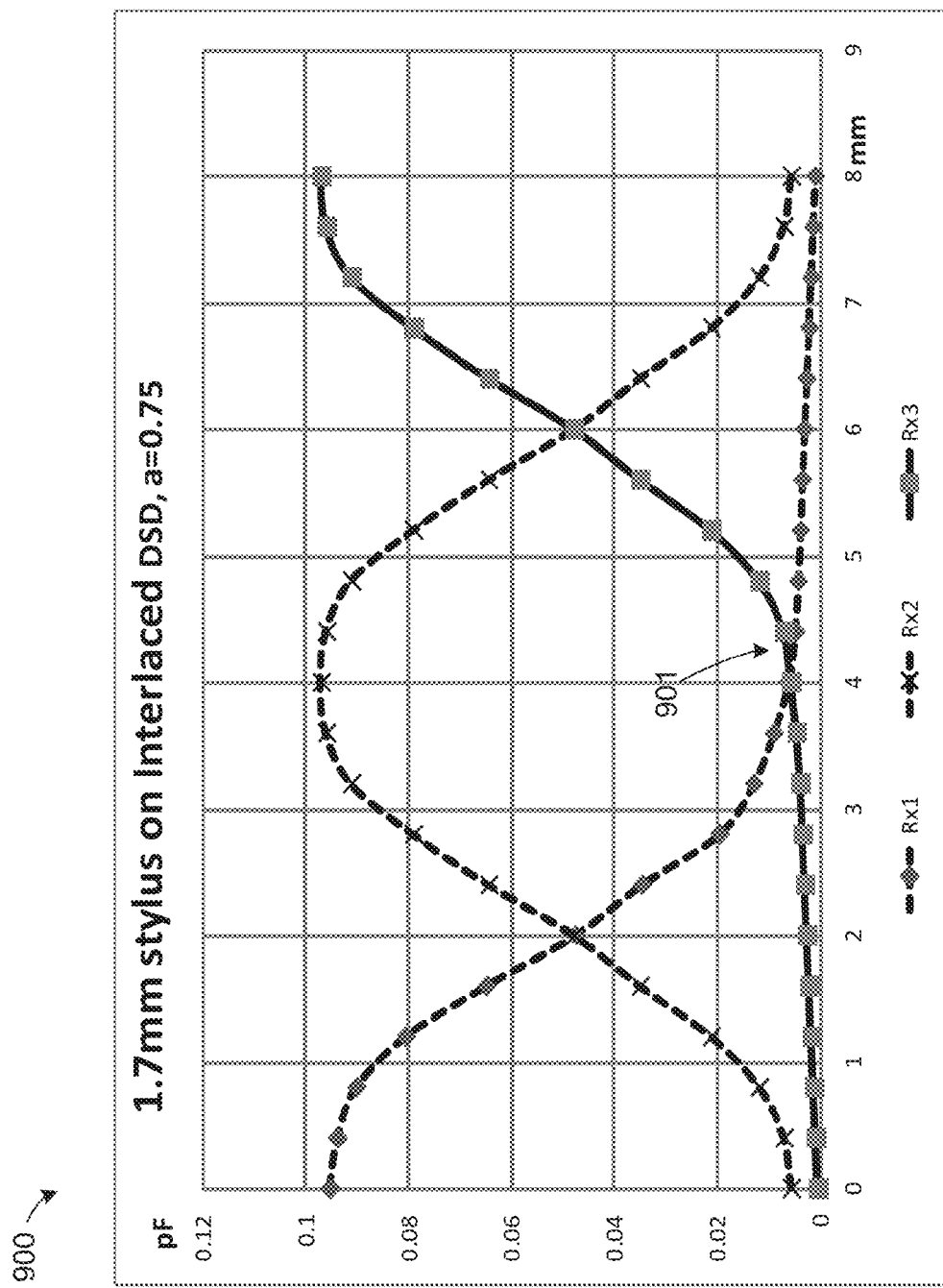
FIG. 9 is a waveform diagram illustrating a signal response of the capacitive-sense array of FIG. 7 according to one embodiment.

Signal profile curves for the unit cells for the DSD array 400 of FIG. 4 and the interleaved DSD array 700 are compared in FIGS. 8-9.

FIG. 8 is a waveform diagram illustrating a signal response of the capacitive-sense array of FIG. 4 according to one embodiment. FIG. 9 is a waveform diagram illustrating a signal response of the capacitive-sense array of FIG. 7 according to one embodiment. For the simulations of FIGS. 8-9, a 1.7 mm stylus was used on a 4 mm pitch sensor cell is used with 0.7 mm cover glass, and the short side, a, of the extended portion 709 in FIG. 9 is 0.75 mm. The graph 800 illustrates simulation results of three unit cells of the DSD array 400 to get a mutual capacitance profile (dCm profile) with no "negative slope". The graph 800 shows the dCm profiles for 1.7 mm stylus moved from the cell Rx1 to the cell Rx3. The dCm profiles in FIG. 8 can be compared to dCm profiles in graph 900 for the interleaved DSD array 700. The graph 900 illustrates simulation results of three unit cells of the interleaved DSD array 700 to get a mutual capacitance profile (dCm profile) with no "negative slope". The graph 900 shows the dCm profiles for 1.7 mm stylus moved from the cell Rx1 to the cell Rx3.

It can be observed that for DSD array 400 in FIG. 8, the signal profiles Rx1 and Rx3 are crossing at near zero value 801 (approximately at 0.0015 pF). If the equivalent noise in the system is above 0.0015 pF, the coordinate will not be possible to calculate. On other hand, as can be observed in FIG. 9, the interleaved DSD array, the signal profiles Rx1 and Rx3 are crossing at a higher value 901 (approximately 0.007 pF level). Thus, the signal in the side lobes is improved 4 times (from 0.0015 to 0.007 pF,) which is equivalent to 4 times signal-to-noise (SNR) improvement. The embodiments have been shown be able to measure a 2 mm stylus with the interleaved DSD array and compute a position with a centroid algorithm with a positional error of 0.67 mm, which is lower than 0.82 mm for 2 mm stylus being measured with the DSD array.

Figure 10C:
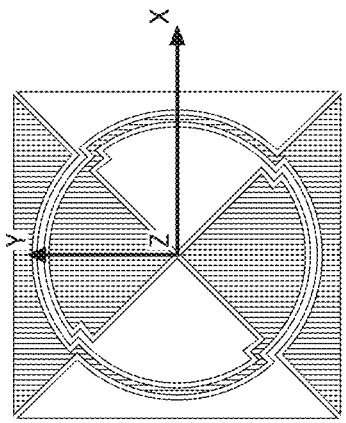
FIG. 10C illustrates a sector swirl region according to one embodiment.
Figure 10B:
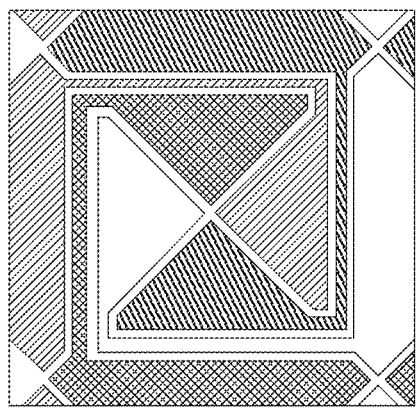
FIG. 10B illustrates a triangle swirl region according to one embodiment.
Figure 10A:
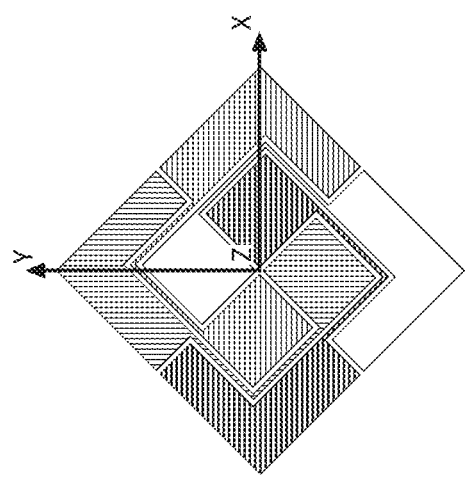
FIG. 10A illustrates a square swirl region according to one embodiment.

Embodiments of interleaved electrodes can be easily implemented in the touchscreens where DSD, SSD and totem pole (TP) patterns are used. As described herein, various patterns can be used for interleaving sense elements to form the interleaving region, as referred to as a swirl region. FIG. 10A illustrates a square swirl region 1002 according to one embodiment. In FIG. 10A, interleaving is done by rectangular shapes and linking traces that are arranged as a "swirl". Other interlacing shapes are possible, for instance in FIGS. 10B-10C are shown triangular and sector shapes. FIG. 10B illustrates a triangle swirl region 1004 according to one embodiment. FIG. 10C illustrates a sector swirl region 1006 according to one embodiment. The swirl regions can be used for interleaving electrodes in a single layer. The swirl regions can be counterclockwise swirls or clockwise swirls. Pattern with swirls can be derived from DSD, SSD or from other patterns. Examples of alternative embodiments are shown in FIGS. 11A-11B and 12.

Figure 11B:
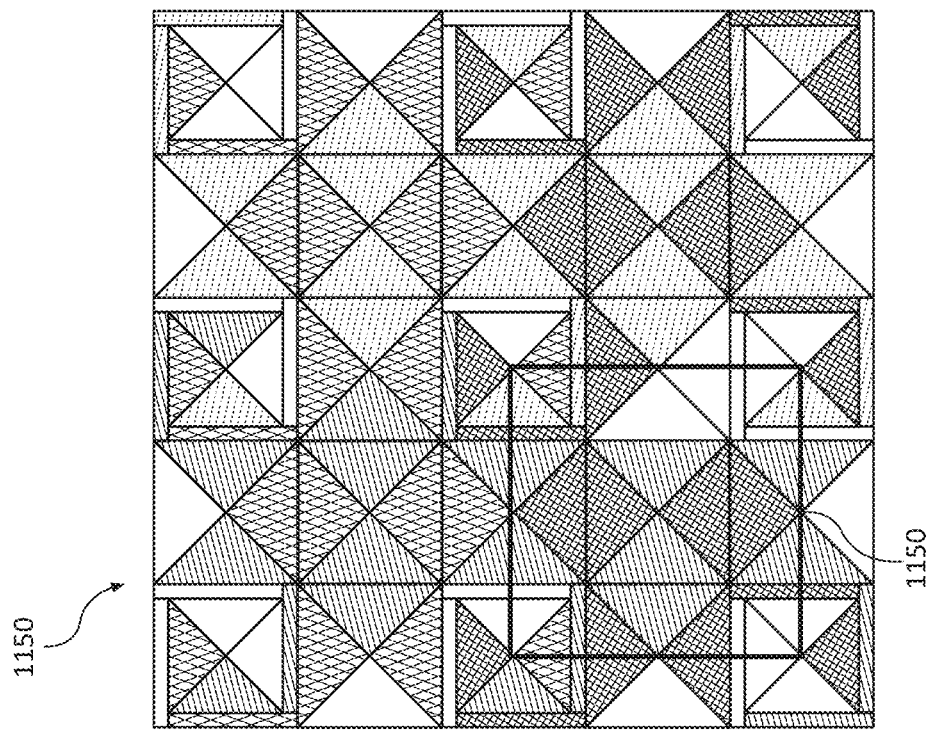
FIG. 11B illustrates triangle swirl electrodes combined in an interleaving DSD pattern according to one embodiment.
Figure 11A:
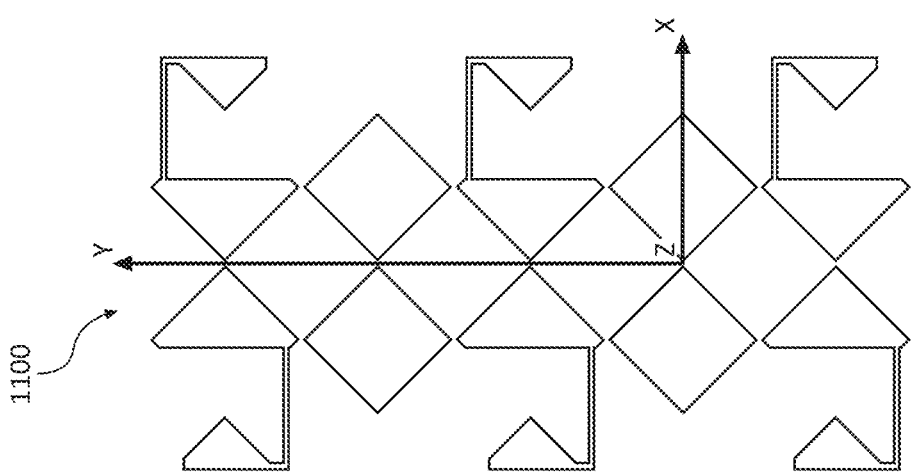
FIG. 11A illustrates a triangle swirl electrode used in an interleaving DSD pattern according to one embodiment.

FIG. 11A illustrates a triangle swirl electrode 1100 used in an interleaving DSD pattern according to one embodiment. In this embodiment, the interleaving sense element has an extended portion, which is a portion of the diamond shape, and the extended portion is inverted and connected to the base portion by a connecting line.

FIG. 11B illustrates triangle swirl electrodes combined in an interleaving DSD pattern 1150 according to one embodiment. FIG. 11B also illustrates a unit cell 1152 (an intersection between triangle swirl electrodes.

Figure 12A:
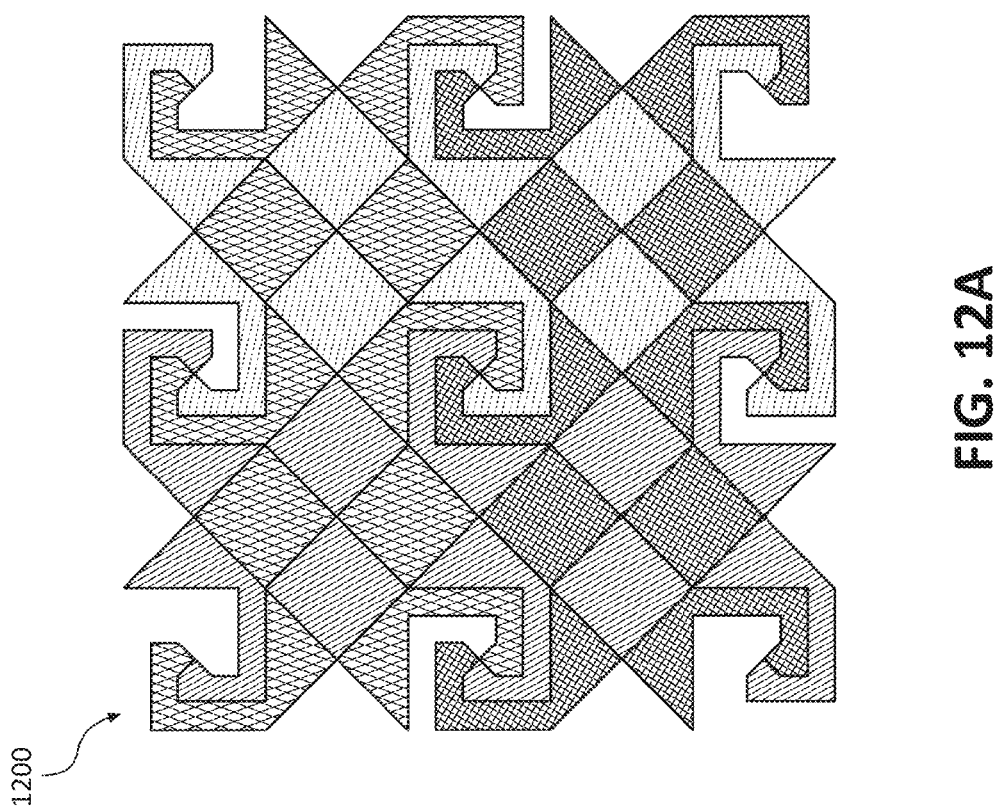
FIG. 12A illustrates a swirl electrode 1200 used in an interleaving DSD pattern according to one embodiment.

FIG. 12A illustrates a swirl electrode 1200 used in an interleaving DSD pattern according to one embodiment. The swirl electrode 1200 is similar to the electrode 1100 with widened linking traces (parameter t).

Figure 12B:
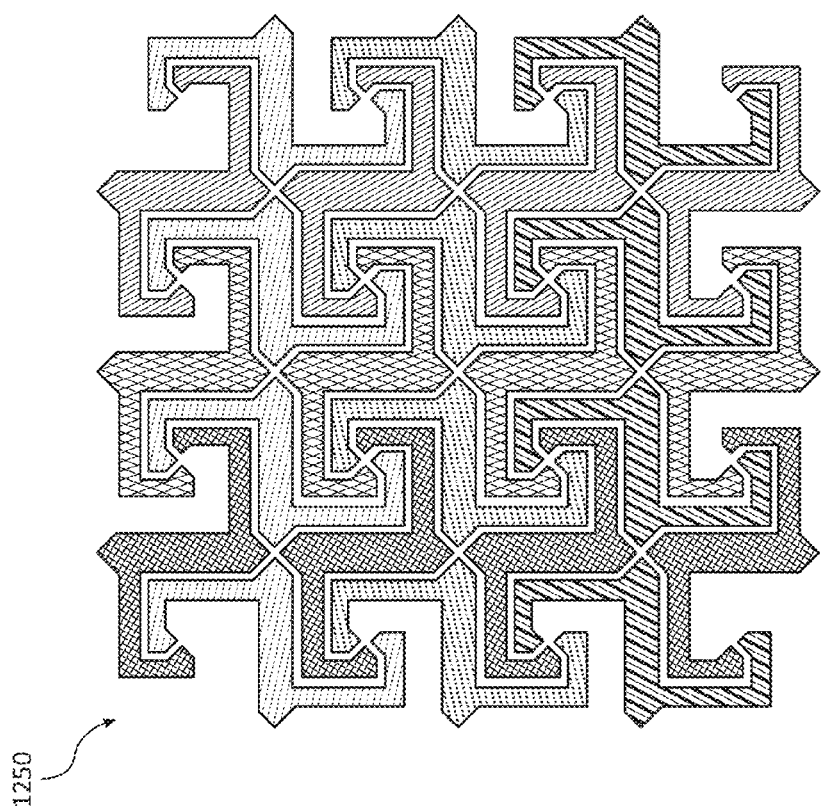
FIG. 12B illustrates another embroidered swirl electrodes used in an interleaving DSD pattern according to another embodiment.

FIG. 12B illustrates an embroidered swirl electrodes used in an interleaving DSD pattern according to one embodiment. In this embodiment, there are very wide linking traces.

Figure 13:
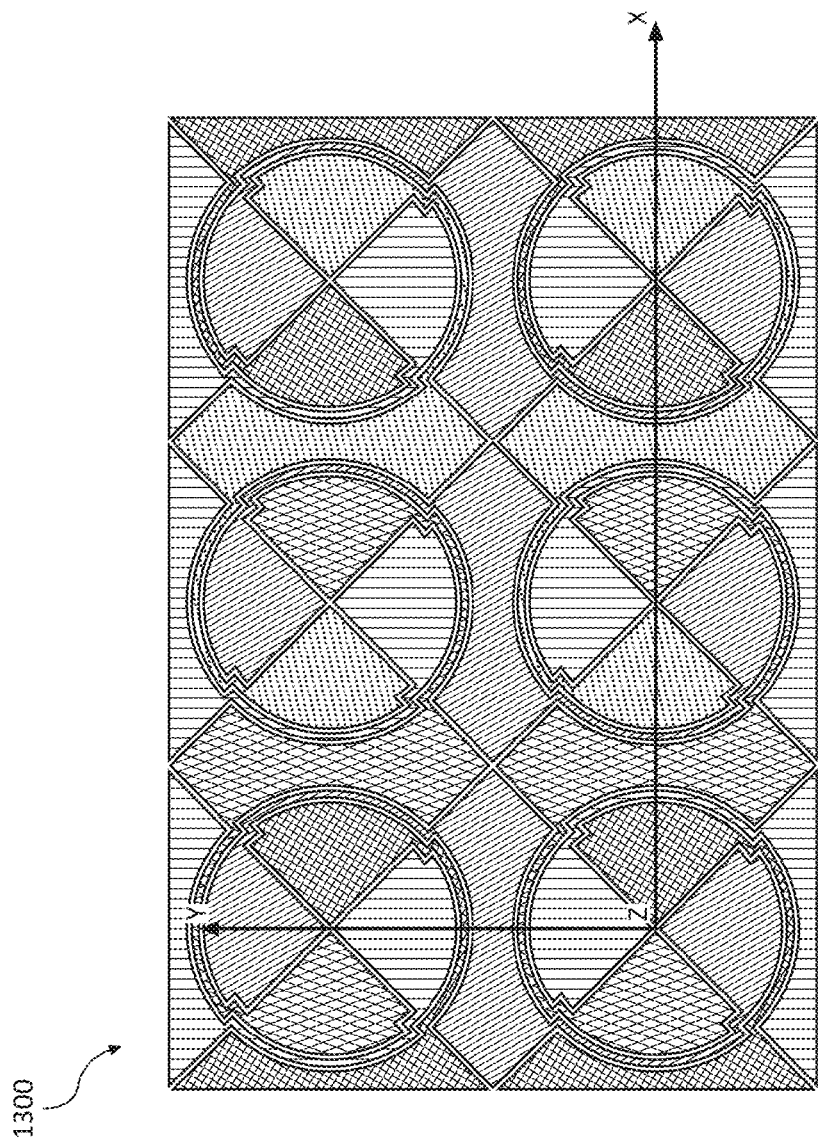
FIG. 13 illustrates a sector swirl electrodes used in an interleaving SSD pattern according to one embodiment.

FIG. 13 illustrates a sector swirl electrodes used in an interleaving SSD pattern 1300 according to one embodiment. In one embodiment, the sector swirl region can be used for SSD. The radius may be 1 mm and the t parameter may equal the s parameter, and they are both 0.05 mm. Alternatively, other dimensions may be used.

Rectangular, triangular and sector shapes were considered in Figures above. These shapes can be slightly modified, for instance, to pentagon or octagon shapes with performance remaining good enough. Also, extensions of electrodes can be made with curved boundaries.

Capacitive-sense arrays, in general, can be used for sensing metal objects in industry. This solution can improve sensitivity of measurement in industrial and biomedical applications.

Noise suppression with 2D measurement method with the embodiments of the patterns describe herein can be as good as in the case with the DSD array of FIG. 5.

Figure 14:
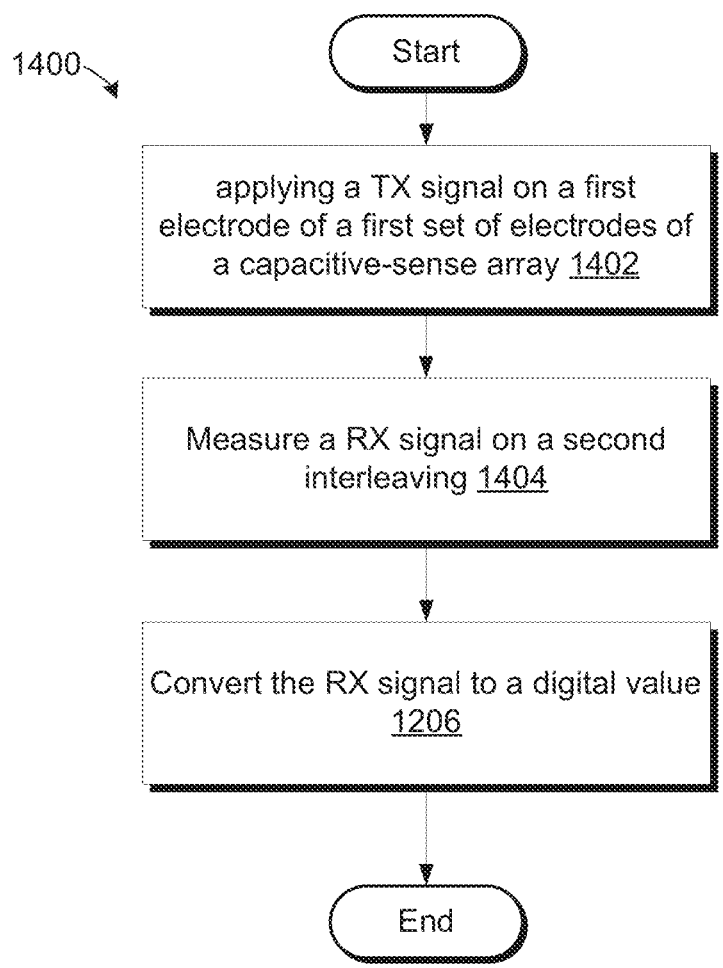
FIG. 14 is a flow diagram of a method of sensing a capacitive-sense array with interleaving sense electrodes according to an embodiment.

FIG. 14 is a flow diagram of a method 1400 of sensing a capacitive-sense array with interleaving sense electrodes according to an embodiment. The method 1400 may be performed by processing logic that may include hardware (circuitry, dedicated logic, etc.), software (such as is run on a general purpose computing system or a dedicated machine), firmware (embedded software), or any combination thereof. In one embodiment, the processing device 110 of FIG. 1 performs some or all of method 1400. In another embodiment, the processing logic 102 of FIG. 1 or FIG. 2 performs some or all of the operations of method 1400. In other embodiments, the capacitance-sensing circuit 101 performs some of the operations of method 1400. Alternatively, other components of the electronic system 100 of FIG. 1 perform some or all of the operations of method 1400.

In FIG. 14, method 1400 begins with the processing logic applying a transmit (TX) signal on a first electrode of a first set of electrodes of a capacitive-sense array including a sensor pitch in a first axis (block 1402). The processing logic measures a receive (RX) signal on a second interleaving electrode of a second set of electrodes (block 1404). The first set of electrodes intersect the second set of electrodes to form unit cells each corresponding to an intersection of a pair of electrodes comprising one electrode from the first set and one electrode from the second set. The second interleaving electrode includes a first sense element comprising a first shape and a first interleaving sense element. The first interleaving sense element is disposed to interleave with a first portion and a second portion of a third electrode of the second set of electrodes. The first interleaving sense element extends a first dimension of the second electrode to be greater than the sensor pitch in the first axis. The processing logic converts the measured RX signal into a first digital value (block 1406). The first digital value represents a first capacitance at the intersection between the first electrode and the second electrode.

In a further embodiment, the processing logic measures a second RX signal on the third electrode of the second set of electrodes. The third electrode includes a second sense element comprising the first shape and a second interleaving sense element. The second interleaving sense element interleaves with a first portion and a second portion of the first interleaving sense element to extend a second dimension of the third electrode to be greater than the sensor pitch in the first axis. The processing logic converts the second RX signal into a second digital value. The second digital value represents a second capacitance at the intersection between the first electrode and the third electrode.

In a further embodiment, the processing logic applies the TX signal on a fourth electrode of the first set of electrodes and measures a third RX signal on the second electrode. The processing logic converts the third RX signal into a third digital value. The third digital value represents a third capacitance at the intersection between the fourth electrode and the second electrode. The processing logic measures a fourth RX signal on the third electrode and converts the fourth RX signal into a fourth digital value. The fourth digital value represents a fourth capacitance at the intersection between the fourth electrode and the third electrode.

The method may also include scanning other interleaving electrodes as described above with respect to FIGS. 6-13.

The processing logic can be implemented in a capacitive touch screen controller. In one embodiment, the capacitive touch screen controller is the TrueTouch® capacitive touch-screen controllers, such as the CY8CTMA3xx family of TrueTouch® Multi-Touch All-Points touchscreen controllers, developed by Cypress Semiconductor Corporation of San Jose, Calif. The TrueTouch® capacitive touchscreen controllers sensing technology to resolve touch locations of multiple fingers and a stylus on the touch-screens, supports leading operating systems, and is optimized for low-power multi-touch gesture and all-point touchscreen functionality. Alternatively, the touch position calculation features may be implemented in other touchscreen controllers, or other touch controllers of touch-sensing devices. In one embodiment, the touch position calculation features may be implemented with other touch filtering algorithms as would be appreciated by one of ordinary skill in the art having the benefit of this disclosure.

The embodiments described herein may be used in various designs of mutual-capacitance sensing arrays of the capacitance sensing system, or in self-capacitance sensing arrays. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A capacitive-sense array comprising:
   a first electrode disposed along a first axis; and
   a second electrode disposed along the first axis, the second electrode disposed adjacent to the first electrode, wherein the capacitive-sense array comprises a sensor pitch in the first axis,
   wherein the first electrode comprises:
      a first sense element comprising a first shape; and
      a first interleaving sense element, wherein the first interleaving sense element is disposed to interleave with an extended portion and a base portion of the second electrode to extend a first dimension of the first electrode to be greater than the sensor pitch in the first axis,
   wherein the second electrode comprises:
      a second sense element comprising the first shape; and
      a second interleaving sense element, wherein the second interleaving sense element is disposed to interleave with an extended portion and a base portion of the first electrode to extend a second dimension of the second electrode to be greater than the sensor pitch in the first axis,
      wherein an area defined by a maximum width of the first electrode and a maximum of height of the first electrode is at least two times a product of the first dimension and the second dimension.

2. The capacitive-sense array of claim 1, wherein the first sense element and the first interleaving sense element comprise a same surface area.

3. The capacitive-sense array of claim 1, wherein the first interleaving sense element comprises a connecting line, wherein the extended portion of the first electrode is coupled to the base portion of the first electrode by the connecting line, and wherein the extended portion of the first electrode is disposed to interleave with the extended portion and the base portion of the second electrode.

4. The capacitive-sense array of claim 3, wherein the first shape is a solid diamond, and wherein the extended portion comprises a smaller diamond shape than the first shape.

5. The capacitive-sense array of claim 1, wherein the first electrode and the second electrode are part of a first set of electrodes along the first axis, and wherein the capacitive-sense array further comprises a second set of electrodes disposed along a second axis, wherein at least one of the second set of electrodes comprises:
   a third sense element comprising a third shape; and
   a third interleaving sense element, wherein the third interleaving sense element interleaves with an extended portion and a base portion of another one of the second set of electrodes to extend a third dimension of the at least one of the second set of electrodes to be greater than a second sensor pitch of the capacitive-sense array in the second axis.

6. The capacitive-sense array of claim 5, wherein the first set of electrodes intersect the second set of electrodes to form a plurality of unit cells each corresponding to an intersection of a pair of electrodes comprising one electrode from the first set and one electrode from the second set.

7. The capacitive-sense array of claim 5, wherein the first set of electrodes comprise a modified double solid diamond (DSD) pattern, wherein the modified DSD pattern comprises:
   a first line of interconnected electrodes comprising first diamond shape elements and first interleaving elements that interleave with portions of the second electrode on a first side;
   a second line of interconnected electrodes comprising second diamond shape elements and second interleaving elements that interleave with portions of a third electrode on a second side.

8. The capacitive-sense array of claim 1, wherein the first electrode and the second electrode are part of a first set of electrodes in the first axis, and wherein the capacitive-sense array further comprises a second set of electrodes disposed in a second axis, and wherein the first set of electrodes and the second set of electrodes are disposed in a single layer.

9. The capacitive-sense array of claim 8, wherein the first set of electrodes and the second set of electrodes comprise a swirl region used for interleaving in the single layer.

10. The capacitive-sense array of claim 9, wherein the swirl region comprise at least one of a square swirl region, a triangle swirl region, or a sector swirl region.

11. The capacitive-sense array of claim 1, wherein the first dimension is two or more times greater than the sensor pitch in the first axis.

12. A method comprising:
   applying a transmit (TX) signal on a first electrode of a first set of electrodes of a capacitive-sense array comprising a sensor pitch along a first axis, the first set of electrodes disposed along the first axis;
   measuring a receive (RX) signal on a second electrode of a second set of electrodes, wherein the second set of electrodes is disposed along a second axis, wherein the first set of electrodes intersect the second set of electrodes to form a plurality of unit cells each corresponding to an intersection of a pair of electrodes comprising one electrode from the first set and one electrode from the second set, wherein the second electrode comprises:
      a first sense element comprising a first shape; and
      a first interleaving sense element, wherein the first interleaving sense element is disposed to interleave with an extended portion and a base portion of a third electrode of the second set of electrodes, wherein the first interleaving sense element extends a first dimension of the second electrode to be greater than the sensor pitch in the first axis, wherein the third electrode comprises a second sense element comprising the first shape and a second interleaving sense element disposed to interleave with an extended portion and a base portion of the second electrode to extend a second dimension of the third electrode to be greater than the sensor pitch in the first axis; and converting the measured RX signal into a first digital value, wherein the first digital value represents a first capacitance at the intersection between the first electrode and the second electrode.

13. The method of claim 12, further comprising:
measuring a second RX signal on the third electrode of the second set of electrodes; and
converting the second RX signal into a second digital value, wherein the second digital value represents a second capacitance at the intersection between the first electrode and the third electrode.

14. The method of claim 13, further comprising:
applying the TX signal on a fourth electrode of the first set of electrodes;
measuring a third RX signal on the second electrode;
converting the third RX signal into a third digital value, wherein the third digital value represents a third capacitance at the intersection between the fourth electrode and the second electrode;
measuring a fourth RX signal on the third electrode; and
converting the fourth RX signal into a fourth digital value, wherein the fourth digital value represents a fourth capacitance at the intersection between the fourth electrode and the third electrode.

15. An apparatus comprising:
a capacitive-sense array of a plurality of electrodes, wherein the plurality of electrodes comprises:
a first set of electrodes disposed along a first axis; and
a second set of electrodes disposed along a second axis, wherein the first set of electrodes intersect the second set of electrodes to form a plurality of unit cells each corresponding to an intersection of a pair of electrodes comprising one electrode from the first set and one electrode from the second set,
wherein a first electrode of the first set of electrodes comprises a first sense element comprising a first shape and a first interleaving sense element,
wherein the first interleaving sense element interleaves with an extended portion and a base portion of a second electrode of the second set of electrodes,
wherein the first interleaving sense element extends a first dimension of the first electrode to be greater than the sensor pitch in the first axis,
wherein the first dimension is two times or greater than the sensor pitch; and
a processing device coupled to the capacitive-sense array, wherein the processing device is configured to measure signals from the capacitive sense-array to determine capacitance values for the plurality of unit cells.

16. The apparatus of claim 15, wherein the first sense element and the first interleaving sense element comprise a same surface area, and wherein the first interleaving sense element comprises a connecting line, wherein the extended portion of the first electrode of the first set of electrodes is coupled to the base portion of the first electrode of the first set of electrodes via the connecting line.

17. The apparatus of claim 15, wherein the second electrode comprises:
a second sense element comprising the first shape; and
a second interleaving sense element, wherein the second interleaving sense element interleaves with an extended portion and a base portion of the first interleaving sense element to extend a second dimension of the second electrode to be greater than the sensor pitch in the first axis, wherein the second dimension is two times or greater than the sensor pitch.

18. The apparatus of claim 17, wherein at least one of the second set of electrodes comprises:
a third sense element comprising a third shape; and
a third interleaving sense element, wherein the third interleaving sense element is disposed to interleave with an extended portion and a base portion of another one of the second set of electrodes to extend a third dimension of the at least one of the second set of electrodes to be greater than a sensor pitch of the capacitive-sense array in the second axis, wherein the third dimension is at least two times or greater than the sensor pitch in the second axis.

19. The apparatus of claim 17, wherein the first set of electrodes and the second set of electrodes are disposed in a single layer.

* * * * *